(12) United States Patent
Rodda et al.

(10) Patent No.: US 9,521,319 B2
(45) Date of Patent: Dec. 13, 2016

(54) ARRAY CAMERAS AND ARRAY CAMERA MODULES INCLUDING SPECTRAL FILTERS DISPOSED OUTSIDE OF A CONSTITUENT IMAGE SENSOR

(71) Applicant: Pelican Imaging Corporation, Santa Clara, CA (US)

(72) Inventors: Errol Mark Rodda, San Jose, CA (US); Jacques Duparré, Jena (DE)

(73) Assignee: Pelican Imaging Corporation, Santa Clara, CA (US)

( * ) Notice: Subject to any disclaimer, the term of this patent is extended or adjusted under 35 U.S.C. 154(b) by 0 days.

(21) Appl. No.: 14/561,925

(22) Filed: Dec. 5, 2014

(65) Prior Publication Data

US 2015/0373261 A1  Dec. 24, 2015

Related U.S. Application Data

(60) Provisional application No. 62/014,021, filed on Jun. 18, 2014.

(51) Int. Cl.
*H04N 5/232* (2006.01)
*H01L 27/146* (2006.01)
*H04N 5/225* (2006.01)

(52) U.S. Cl.
CPC .... *H04N 5/23232* (2013.01); *H01L 27/14621* (2013.01); *H01L 27/14627* (2013.01); *H04N 5/2254* (2013.01)

(58) Field of Classification Search
CPC ............ H04N 5/2251–5/2254; G06T 2200/21; G06T 2207/10052
See application file for complete search history.

(56) References Cited

U.S. PATENT DOCUMENTS

| 4,124,798 A | 11/1978 | Thompson |
| 4,198,646 A | 4/1980 | Alexander et al. |

(Continued)

FOREIGN PATENT DOCUMENTS

| CN | 1839394 A | 9/2006 |
| CN | 101010619 A | 8/2007 |

(Continued)

OTHER PUBLICATIONS

US 8,957,977, 02/2015, Venkataraman et al. (withdrawn)

(Continued)

*Primary Examiner* — Timothy J Henn
(74) *Attorney, Agent, or Firm* — KPPB LLP

(57) ABSTRACT

Systems and methods in accordance with embodiments of the invention implement array cameras and array camera modules that have spectral filters disposed outside of constituent image sensors. In one embodiment, an array camera module includes: a lens stack array including lens elements arranged to form a plurality of optical channels, each optical channel including a field-of-view that is shifted with respect to the fields-of-views of each other optical channel so that each shift includes a sub-pixel shifted view of the scene, a glass substrate located within an optical channel, and a spectral filter disposed within, or else proximate to, a glass substrate within the lens stack array; and an imager array including a plurality of focal planes, where each focal plane includes a plurality of rows of pixels that also form a plurality of columns of pixels, and where each focal plane does not include pixels from another focal plane.

18 Claims, 9 Drawing Sheets

(56) References Cited

U.S. PATENT DOCUMENTS

| | | |
|---|---|---|
| 4,323,925 A | 4/1982 | Abell et al. |
| 4,460,449 A | 7/1984 | Montalbano |
| 4,467,365 A | 8/1984 | Murayama et al. |
| 5,005,083 A | 4/1991 | Grage |
| 5,070,414 A | 12/1991 | Tsutsumi |
| 5,144,448 A | 9/1992 | Hornbaker |
| 5,327,125 A | 7/1994 | Iwase et al. |
| 5,629,524 A | 5/1997 | Stettner et al. |
| 5,808,350 A | 9/1998 | Jack et al. |
| 5,832,312 A | 11/1998 | Rieger et al. |
| 5,880,691 A | 3/1999 | Fossum et al. |
| 5,933,190 A | 8/1999 | Dierickx et al. |
| 5,973,844 A | 10/1999 | Burger |
| 6,002,743 A | 12/1999 | Telymonde |
| 6,005,607 A | 12/1999 | Uomori et al. |
| 6,034,690 A | 3/2000 | Gallery et al. |
| 6,069,351 A | 5/2000 | Mack |
| 6,069,365 A | 5/2000 | Chow et al. |
| 6,097,394 A | 8/2000 | Levoy et al. |
| 6,124,974 A | 9/2000 | Burger |
| 6,137,535 A | 10/2000 | Meyers |
| 6,141,048 A | 10/2000 | Meyers |
| 6,160,909 A | 12/2000 | Melen |
| 6,163,414 A | 12/2000 | Kikuchi et al. |
| 6,172,352 B1 | 1/2001 | Liu et al. |
| 6,175,379 B1 | 1/2001 | Uomori et al. |
| 6,205,241 B1 | 3/2001 | Melen |
| 6,239,909 B1 | 5/2001 | Hayashi et al. |
| 6,358,862 B1 | 3/2002 | Ireland et al. |
| 6,476,805 B1 | 11/2002 | Shum et al. |
| 6,477,260 B1 | 11/2002 | Shimomura |
| 6,502,097 B1 | 12/2002 | Chan et al. |
| 6,525,302 B2 | 2/2003 | Dowski, Jr. et al. |
| 6,563,537 B1 | 5/2003 | Kawamura et al. |
| 6,571,466 B1 | 6/2003 | Glenn et al. |
| 6,603,513 B1 | 8/2003 | Berezin |
| 6,611,289 B1 | 8/2003 | Yu |
| 6,627,896 B1 | 9/2003 | Hashimoto et al. |
| 6,628,330 B1 | 9/2003 | Lin |
| 6,635,941 B2 | 10/2003 | Suda |
| 6,639,596 B1 | 10/2003 | Shum et al. |
| 6,657,218 B2 | 12/2003 | Noda |
| 6,671,399 B1 | 12/2003 | Berestov |
| 6,750,904 B1 | 6/2004 | Lambert |
| 6,765,617 B1 | 7/2004 | Tangen et al. |
| 6,771,833 B1 | 8/2004 | Edgar |
| 6,774,941 B1 | 8/2004 | Boisvert et al. |
| 6,795,253 B2 | 9/2004 | Shinohara |
| 6,819,358 B1 | 11/2004 | Kagle et al. |
| 6,879,735 B1 | 4/2005 | Portniaguine et al. |
| 6,903,770 B1 | 6/2005 | Kobayashi et al. |
| 6,909,121 B2 | 6/2005 | Nishikawa |
| 6,927,922 B2 | 8/2005 | George et al. |
| 6,958,862 B1 | 10/2005 | Joseph |
| 7,015,954 B1 | 3/2006 | Foote et al. |
| 7,085,409 B2 | 8/2006 | Sawhney et al. |
| 7,161,614 B1 | 1/2007 | Yamashita et al. |
| 7,199,348 B2 | 4/2007 | Olsen et al. |
| 7,235,785 B2 | 6/2007 | Hornback et al. |
| 7,262,799 B2 | 8/2007 | Suda |
| 7,292,735 B2 | 11/2007 | Blake et al. |
| 7,295,697 B1 | 11/2007 | Satoh |
| 7,369,165 B2 | 5/2008 | Bosco et al. |
| 7,391,572 B2 | 6/2008 | Jacobowitz et al. |
| 7,408,725 B2 | 8/2008 | Sato |
| 7,425,984 B2 | 9/2008 | Chen |
| 7,606,484 B1 | 10/2009 | Richards et al. |
| 7,633,511 B2 | 12/2009 | Shum et al. |
| 7,639,435 B2 | 12/2009 | Chiang et al. |
| 7,646,549 B2 | 1/2010 | Zalevsky et al. |
| 7,657,090 B2 | 2/2010 | Omatsu et al. |
| 7,675,080 B2 | 3/2010 | Boettiger |
| 7,675,681 B2 | 3/2010 | Tomikawa et al. |
| 7,706,634 B2 | 4/2010 | Schmitt et al. |
| 7,723,662 B2 | 5/2010 | Levoy et al. |
| 7,782,364 B2 | 8/2010 | Smith |
| 7,826,153 B2 | 11/2010 | Hong |
| 7,840,067 B2 | 11/2010 | Shen et al. |
| 7,912,673 B2 | 3/2011 | Hébert et al. |
| 7,973,834 B2 | 7/2011 | Yang |
| 7,986,018 B2 | 7/2011 | Rennie |
| 7,990,447 B2 | 8/2011 | Honda et al. |
| 8,000,498 B2 | 8/2011 | Shih et al. |
| 8,013,904 B2 | 9/2011 | Tan et al. |
| 8,027,531 B2 | 9/2011 | Wilburn et al. |
| 8,044,994 B2 | 10/2011 | Vetro et al. |
| 8,077,245 B2 | 12/2011 | Adamo et al. |
| 8,098,297 B2 | 1/2012 | Crisan et al. |
| 8,098,304 B2 | 1/2012 | Pinto et al. |
| 8,106,949 B2 | 1/2012 | Tan et al. |
| 8,126,279 B2 | 2/2012 | Marcellin et al. |
| 8,130,120 B2 | 3/2012 | Kawabata et al. |
| 8,131,097 B2 | 3/2012 | Lelescu et al. |
| 8,164,629 B1 | 4/2012 | Zhang |
| 8,169,486 B2 | 5/2012 | Corcoran et al. |
| 8,180,145 B2 | 5/2012 | Wu et al. |
| 8,189,065 B2 | 5/2012 | Georgiev et al. |
| 8,189,089 B1 | 5/2012 | Georgiev et al. |
| 8,212,914 B2 | 7/2012 | Chiu |
| 8,213,711 B2 | 7/2012 | Tam |
| 8,231,814 B2 | 7/2012 | Duparre |
| 8,242,426 B2 | 8/2012 | Ward et al. |
| 8,244,027 B2 | 8/2012 | Takahashi |
| 8,244,058 B1 | 8/2012 | Intwala et al. |
| 8,254,668 B2 | 8/2012 | Mashitani et al. |
| 8,279,325 B2 | 10/2012 | Pitts et al. |
| 8,280,194 B2 | 10/2012 | Wong et al. |
| 8,289,409 B2 | 10/2012 | Chang |
| 8,289,440 B2 | 10/2012 | Pitts et al. |
| 8,290,358 B1 | 10/2012 | Georgiev |
| 8,294,099 B2 | 10/2012 | Blackwell, Jr. |
| 8,305,456 B1 | 11/2012 | McMahon |
| 8,315,476 B1 | 11/2012 | Georgiev et al. |
| 8,345,144 B1 | 1/2013 | Georgiev et al. |
| 8,360,574 B2 | 1/2013 | Ishak et al. |
| 8,400,555 B1 | 3/2013 | Georgiev |
| 8,406,562 B2 | 3/2013 | Bassi et al. |
| 8,446,492 B2 | 5/2013 | Nakano et al. |
| 8,514,491 B2 | 8/2013 | Duparre |
| 8,541,730 B2 | 9/2013 | Inuiya |
| 8,542,933 B2 | 9/2013 | Venkataraman et al. |
| 8,553,093 B2 | 10/2013 | Wong et al. |
| 8,559,756 B2 | 10/2013 | Georgiev et al. |
| 8,581,995 B2 | 11/2013 | Lin et al. |
| 8,619,082 B1 | 12/2013 | Ciurea et al. |
| 8,648,918 B2 | 2/2014 | Kauker et al. |
| 8,655,052 B2 | 2/2014 | Spooner et al. |
| 8,682,107 B2 | 3/2014 | Yoon et al. |
| 8,692,893 B2 | 4/2014 | McMahon |
| 8,773,536 B1 | 7/2014 | Zhang |
| 8,780,113 B1 | 7/2014 | Ciurea et al. |
| 8,804,255 B2 | 8/2014 | Duparre |
| 8,830,375 B2 | 9/2014 | Ludwig |
| 8,831,367 B2 | 9/2014 | Venkataraman et al. |
| 8,842,201 B2 | 9/2014 | Tajiri |
| 8,854,462 B2 | 10/2014 | Herbin et al. |
| 8,861,089 B2 | 10/2014 | Duparre |
| 8,866,912 B2 | 10/2014 | Mullis |
| 8,866,920 B2 | 10/2014 | Venkataraman et al. |
| 8,866,951 B2 | 10/2014 | Keelan |
| 8,878,950 B2 | 11/2014 | Lelescu et al. |
| 8,885,059 B1 | 11/2014 | Venkataraman et al. |
| 8,896,594 B2 | 11/2014 | Xiong et al. |
| 8,896,719 B1 | 11/2014 | Venkataraman et al. |
| 8,902,321 B2 | 12/2014 | Venkataraman et al. |
| 8,928,793 B2 | 1/2015 | McMahon |
| 9,019,426 B2 | 4/2015 | Han et al. |
| 9,025,894 B2 | 5/2015 | Venkataraman et al. |
| 9,025,895 B2 | 5/2015 | Venkataraman et al. |
| 9,031,335 B2 | 5/2015 | Venkataraman et al. |
| 9,031,342 B2 | 5/2015 | Venkataraman et al. |
| 9,031,343 B2 | 5/2015 | Venkataraman et al. |
| 9,036,928 B2 | 5/2015 | Venkataraman et al. |
| 9,036,931 B2 | 5/2015 | Venkataraman et al. |

(56) References Cited

U.S. PATENT DOCUMENTS

| | | |
|---|---|---|
| 9,041,823 B2 | 5/2015 | Venkataraman et al. |
| 9,041,824 B2 | 5/2015 | Lelescu et al. |
| 9,041,829 B2 | 5/2015 | Venkataraman et al. |
| 9,042,667 B2 | 5/2015 | Venkataraman et al. |
| 9,128,228 B2 | 9/2015 | Duparre |
| 9,210,392 B2 | 12/2015 | Nisenzon et al. |
| 9,264,610 B2 | 2/2016 | Duparre |
| 2001/0005225 A1 | 6/2001 | Clark et al. |
| 2001/0019621 A1 | 9/2001 | Hanna et al. |
| 2001/0038387 A1 | 11/2001 | Tomooka et al. |
| 2002/0012056 A1 | 1/2002 | Trevino et al. |
| 2002/0027608 A1 | 3/2002 | Johnson et al. |
| 2002/0039438 A1 | 4/2002 | Mori et al. |
| 2002/0063807 A1 | 5/2002 | Margulis |
| 2002/0087403 A1 | 7/2002 | Meyers et al. |
| 2002/0089596 A1 | 7/2002 | Suda |
| 2002/0094027 A1 | 7/2002 | Sato et al. |
| 2002/0101528 A1 | 8/2002 | Lee |
| 2002/0113867 A1 | 8/2002 | Takigawa et al. |
| 2002/0113888 A1 | 8/2002 | Sonoda et al. |
| 2002/0163054 A1 | 11/2002 | Suda et al. |
| 2002/0167537 A1 | 11/2002 | Trajkovic |
| 2002/0177054 A1 | 11/2002 | Saitoh et al. |
| 2003/0025227 A1 | 2/2003 | Daniell |
| 2003/0086079 A1 | 5/2003 | Barth et al. |
| 2003/0124763 A1 | 7/2003 | Fan et al. |
| 2003/0140347 A1 | 7/2003 | Varsa |
| 2003/0179418 A1 | 9/2003 | Wengender et al. |
| 2003/0190072 A1 | 10/2003 | Adkins et al. |
| 2003/0211405 A1 | 11/2003 | Venkataraman |
| 2004/0008271 A1 | 1/2004 | Hagimori et al. |
| 2004/0012689 A1 | 1/2004 | Tinnerino |
| 2004/0027358 A1 | 2/2004 | Nakao |
| 2004/0047274 A1 | 3/2004 | Amanai |
| 2004/0050104 A1 | 3/2004 | Ghosh et al. |
| 2004/0056966 A1 | 3/2004 | Schechner et al. |
| 2004/0061787 A1 | 4/2004 | Liu et al. |
| 2004/0066454 A1 | 4/2004 | Otani et al. |
| 2004/0100570 A1 | 5/2004 | Shizukuishi |
| 2004/0105021 A1 | 6/2004 | Hu et al. |
| 2004/0114807 A1 | 6/2004 | Lelescu et al. |
| 2004/0151401 A1 | 8/2004 | Sawhney et al. |
| 2004/0165090 A1 | 8/2004 | Ning |
| 2004/0169617 A1 | 9/2004 | Yelton et al. |
| 2004/0170340 A1 | 9/2004 | Tipping et al. |
| 2004/0174439 A1 | 9/2004 | Upton |
| 2004/0179834 A1 | 9/2004 | Szajewski |
| 2004/0207836 A1 | 10/2004 | Chhibber et al. |
| 2004/0213449 A1 | 10/2004 | Safaee-Rad et al. |
| 2004/0218809 A1 | 11/2004 | Blake et al. |
| 2004/0234873 A1 | 11/2004 | Venkataraman |
| 2004/0240052 A1 | 12/2004 | Minefuji et al. |
| 2004/0251509 A1 | 12/2004 | Choi |
| 2004/0264806 A1 | 12/2004 | Herley |
| 2005/0006477 A1 | 1/2005 | Patel |
| 2005/0009313 A1 | 1/2005 | Suzuki et al. |
| 2005/0012035 A1 | 1/2005 | Miller |
| 2005/0036778 A1 | 2/2005 | DeMonte |
| 2005/0047678 A1 | 3/2005 | Jones et al. |
| 2005/0048690 A1 | 3/2005 | Yamamoto |
| 2005/0068436 A1 | 3/2005 | Fraenkel et al. |
| 2005/0128595 A1 | 6/2005 | Shimizu |
| 2005/0132098 A1 | 6/2005 | Sonoda et al. |
| 2005/0134712 A1 | 6/2005 | Gruhlke et al. |
| 2005/0147277 A1 | 7/2005 | Higaki et al. |
| 2005/0151759 A1 | 7/2005 | Gonzalez-Banos et al. |
| 2005/0175257 A1 | 8/2005 | Kuroki |
| 2005/0185711 A1 | 8/2005 | Pfister et al. |
| 2005/0205785 A1 | 9/2005 | Hornback et al. |
| 2005/0219363 A1 | 10/2005 | Kohler |
| 2005/0225654 A1 | 10/2005 | Feldman et al. |
| 2005/0275946 A1 | 12/2005 | Choo et al. |
| 2005/0286612 A1 | 12/2005 | Takanashi |
| 2005/0286756 A1 | 12/2005 | Hong et al. |
| 2006/0002635 A1 | 1/2006 | Nestares et al. |
| 2006/0023197 A1 | 2/2006 | Joel |
| 2006/0023314 A1 | 2/2006 | Boettiger et al. |
| 2006/0028476 A1 | 2/2006 | Sobel et al. |
| 2006/0033005 A1 | 2/2006 | Jerdev et al. |
| 2006/0034003 A1 | 2/2006 | Zalevsky |
| 2006/0035415 A1* | 2/2006 | Wood ............... H01L 27/14618 438/125 |
| 2006/0038891 A1 | 2/2006 | Okutomi et al. |
| 2006/0046204 A1* | 3/2006 | Ono .................... G02B 3/0012 430/321 |
| 2006/0049930 A1 | 3/2006 | Zruya et al. |
| 2006/0054780 A1 | 3/2006 | Garrood et al. |
| 2006/0054782 A1 | 3/2006 | Olsen et al. |
| 2006/0055811 A1 | 3/2006 | Frtiz et al. |
| 2006/0069478 A1 | 3/2006 | Iwama |
| 2006/0072029 A1 | 4/2006 | Miyatake et al. |
| 2006/0087747 A1 | 4/2006 | Ohzawa et al. |
| 2006/0098888 A1 | 5/2006 | Morishita |
| 2006/0125936 A1 | 6/2006 | Gruhike et al. |
| 2006/0138322 A1 | 6/2006 | Costello et al. |
| 2006/0152803 A1 | 7/2006 | Provitola |
| 2006/0157640 A1 | 7/2006 | Perlman et al. |
| 2006/0159369 A1 | 7/2006 | Young |
| 2006/0176566 A1 | 8/2006 | Boettiger et al. |
| 2006/0187338 A1 | 8/2006 | May et al. |
| 2006/0197937 A1 | 9/2006 | Bamji et al. |
| 2006/0203113 A1 | 9/2006 | Wada et al. |
| 2006/0210186 A1 | 9/2006 | Berkner |
| 2006/0239549 A1 | 10/2006 | Kelly et al. |
| 2006/0243889 A1 | 11/2006 | Farnworth et al. |
| 2006/0251410 A1 | 11/2006 | Trutna |
| 2006/0274174 A1 | 12/2006 | Tewinkle |
| 2006/0278948 A1 | 12/2006 | Yamaguchi et al. |
| 2006/0279648 A1 | 12/2006 | Senba et al. |
| 2007/0002159 A1 | 1/2007 | Olsen et al. |
| 2007/0008575 A1 | 1/2007 | Yu et al. |
| 2007/0024614 A1 | 2/2007 | Tam |
| 2007/0036427 A1 | 2/2007 | Nakamura et al. |
| 2007/0040828 A1 | 2/2007 | Zalevsky et al. |
| 2007/0040922 A1 | 2/2007 | McKee et al. |
| 2007/0041391 A1 | 2/2007 | Lin et al. |
| 2007/0052825 A1 | 3/2007 | Cho |
| 2007/0083114 A1 | 4/2007 | Yang et al. |
| 2007/0085917 A1 | 4/2007 | Kobayashi |
| 2007/0102622 A1 | 5/2007 | Olsen et al. |
| 2007/0126898 A1 | 6/2007 | Feldman et al. |
| 2007/0127831 A1 | 6/2007 | Venkataraman |
| 2007/0139333 A1 | 6/2007 | Sato et al. |
| 2007/0146511 A1 | 6/2007 | Kinoshita et al. |
| 2007/0158427 A1 | 7/2007 | Zhu et al. |
| 2007/0159541 A1 | 7/2007 | Sparks et al. |
| 2007/0160310 A1 | 7/2007 | Tanida et al. |
| 2007/0165931 A1 | 7/2007 | Higaki |
| 2007/0171290 A1 | 7/2007 | Kroger |
| 2007/0182843 A1* | 8/2007 | Shimamura et al. .......... 348/340 |
| 2007/0206241 A1 | 9/2007 | Smith et al. |
| 2007/0211164 A1 | 9/2007 | Olsen et al. |
| 2007/0216765 A1 | 9/2007 | Wong et al. |
| 2007/0228256 A1 | 10/2007 | Mentzer |
| 2007/0257184 A1 | 11/2007 | Olsen et al. |
| 2007/0258006 A1 | 11/2007 | Olsen et al. |
| 2007/0258706 A1 | 11/2007 | Raskar et al. |
| 2007/0263114 A1 | 11/2007 | Gurevich et al. |
| 2007/0268374 A1 | 11/2007 | Robinson |
| 2007/0296832 A1 | 12/2007 | Ota et al. |
| 2007/0296835 A1 | 12/2007 | Olsen et al. |
| 2007/0296847 A1 | 12/2007 | Chang et al. |
| 2008/0006859 A1* | 1/2008 | Mionetto ..................... 257/294 |
| 2008/0019611 A1 | 1/2008 | Larkin |
| 2008/0025649 A1 | 1/2008 | Liu et al. |
| 2008/0030597 A1 | 2/2008 | Olsen et al. |
| 2008/0043095 A1 | 2/2008 | Vetro et al. |
| 2008/0043096 A1 | 2/2008 | Vetro et al. |
| 2008/0054518 A1 | 3/2008 | Ra et al. |
| 2008/0062164 A1 | 3/2008 | Bassi et al. |
| 2008/0079805 A1 | 4/2008 | Takagi et al. |
| 2008/0080028 A1 | 4/2008 | Bakin et al. |
| 2008/0084486 A1 | 4/2008 | Enge et al. |
| 2008/0088793 A1 | 4/2008 | Sverdrup et al. |

(56) References Cited

U.S. PATENT DOCUMENTS

| | | |
|---|---|---|
| 2008/0095523 A1 | 4/2008 | Schilling-Benz |
| 2008/0099804 A1* | 5/2008 | Venezia et al. ............... 257/291 |
| 2008/0112059 A1 | 5/2008 | Choi et al. |
| 2008/0112635 A1 | 5/2008 | Kondo et al. |
| 2008/0118241 A1 | 5/2008 | Tekolste et al. |
| 2008/0131019 A1 | 6/2008 | Ng |
| 2008/0131107 A1 | 6/2008 | Ueno |
| 2008/0151097 A1 | 6/2008 | Chen et al. |
| 2008/0152215 A1 | 6/2008 | Horie et al. |
| 2008/0152296 A1 | 6/2008 | Oh et al. |
| 2008/0158259 A1 | 7/2008 | Kempf et al. |
| 2008/0158375 A1 | 7/2008 | Kakkori et al. |
| 2008/0158698 A1 | 7/2008 | Chang et al. |
| 2008/0187305 A1 | 8/2008 | Raskar et al. |
| 2008/0193026 A1 | 8/2008 | Horie et al. |
| 2008/0218610 A1 | 9/2008 | Chapman et al. |
| 2008/0219654 A1 | 9/2008 | Border et al. |
| 2008/0239116 A1 | 10/2008 | Smith |
| 2008/0240598 A1 | 10/2008 | Hasegawa |
| 2008/0247638 A1 | 10/2008 | Tanida et al. |
| 2008/0247653 A1 | 10/2008 | Moussavi et al. |
| 2008/0272416 A1 | 11/2008 | Yun |
| 2008/0273751 A1 | 11/2008 | Yuan et al. |
| 2008/0278591 A1 | 11/2008 | Barna et al. |
| 2008/0298674 A1 | 12/2008 | Baker et al. |
| 2009/0050946 A1 | 2/2009 | Duparre et al. |
| 2009/0052743 A1 | 2/2009 | Techmer |
| 2009/0060281 A1 | 3/2009 | Tanida et al. |
| 2009/0086074 A1 | 4/2009 | Li et al. |
| 2009/0091806 A1 | 4/2009 | Inuiya |
| 2009/0096050 A1 | 4/2009 | Park |
| 2009/0102956 A1 | 4/2009 | Georgiev |
| 2009/0109306 A1 | 4/2009 | Shan et al. |
| 2009/0128833 A1 | 5/2009 | Yahav |
| 2009/0129667 A1 | 5/2009 | Ho |
| 2009/0140131 A1 | 6/2009 | Utagawa et al. |
| 2009/0152664 A1 | 6/2009 | Klem et al. |
| 2009/0167922 A1 | 7/2009 | Perlman et al. |
| 2009/0179142 A1 | 7/2009 | Duparre et al. |
| 2009/0180021 A1 | 7/2009 | Kikuchi et al. |
| 2009/0200622 A1 | 8/2009 | Tai et al. |
| 2009/0201371 A1 | 8/2009 | Matsuda et al. |
| 2009/0207235 A1 | 8/2009 | Francini et al. |
| 2009/0219435 A1* | 9/2009 | Yuan ............................ 348/360 |
| 2009/0225203 A1 | 9/2009 | Tanida et al. |
| 2009/0237520 A1 | 9/2009 | Kaneko et al. |
| 2009/0245573 A1 | 10/2009 | Saptharishi et al. |
| 2009/0263017 A1 | 10/2009 | Tanbakuchi |
| 2009/0268192 A1 | 10/2009 | Koenck et al. |
| 2009/0268970 A1 | 10/2009 | Babacan et al. |
| 2009/0268983 A1 | 10/2009 | Stone |
| 2009/0274387 A1 | 11/2009 | Jin |
| 2009/0284651 A1 | 11/2009 | Srinivasan |
| 2009/0297056 A1 | 12/2009 | Lelescu et al. |
| 2009/0302205 A9 | 12/2009 | Olsen et al. |
| 2009/0323195 A1 | 12/2009 | Hembree et al. |
| 2009/0323206 A1 | 12/2009 | Oliver et al. |
| 2009/0324118 A1 | 12/2009 | Maslov et al. |
| 2010/0002126 A1 | 1/2010 | Wenstrand et al. |
| 2010/0002313 A1 | 1/2010 | Duparre et al. |
| 2010/0002314 A1 | 1/2010 | Duparre |
| 2010/0013927 A1 | 1/2010 | Nixon |
| 2010/0044815 A1* | 2/2010 | Chang ........................... 257/432 |
| 2010/0053342 A1 | 3/2010 | Hwang et al. |
| 2010/0053600 A1 | 3/2010 | Tanida et al. |
| 2010/0060746 A9 | 3/2010 | Olsen et al. |
| 2010/0073463 A1 | 3/2010 | Momonoi et al. |
| 2010/0074532 A1 | 3/2010 | Gordon et al. |
| 2010/0085425 A1 | 4/2010 | Tan |
| 2010/0086227 A1 | 4/2010 | Sun et al. |
| 2010/0091389 A1 | 4/2010 | Henriksen et al. |
| 2010/0097491 A1 | 4/2010 | Farina et al. |
| 2010/0103259 A1 | 4/2010 | Tanida et al. |
| 2010/0103308 A1 | 4/2010 | Butterfield et al. |
| 2010/0111444 A1 | 5/2010 | Coffman |
| 2010/0118127 A1 | 5/2010 | Nam |
| 2010/0133230 A1 | 6/2010 | Henriksen et al. |
| 2010/0133418 A1 | 6/2010 | Sargent et al. |
| 2010/0141802 A1 | 6/2010 | Knight et al. |
| 2010/0142839 A1 | 6/2010 | Lakus-Becker |
| 2010/0157073 A1 | 6/2010 | Kondo et al. |
| 2010/0165152 A1 | 7/2010 | Lim |
| 2010/0166410 A1 | 7/2010 | Chang et al. |
| 2010/0177411 A1 | 7/2010 | Hegde et al. |
| 2010/0194901 A1 | 8/2010 | van Hoorebeke et al. |
| 2010/0195716 A1 | 8/2010 | Klein et al. |
| 2010/0201834 A1 | 8/2010 | Maruyama et al. |
| 2010/0202054 A1 | 8/2010 | Niederer |
| 2010/0208100 A9 | 8/2010 | Olsen et al. |
| 2010/0220212 A1 | 9/2010 | Perlman et al. |
| 2010/0231285 A1 | 9/2010 | Boomer et al. |
| 2010/0244165 A1 | 9/2010 | Lake et al. |
| 2010/0265381 A1 | 10/2010 | Yamamoto et al. |
| 2010/0265385 A1 | 10/2010 | Knight et al. |
| 2010/0281070 A1 | 11/2010 | Chan et al. |
| 2010/0302423 A1 | 12/2010 | Adams, Jr. et al. |
| 2010/0309292 A1 | 12/2010 | Ho et al. |
| 2010/0309368 A1* | 12/2010 | Choi .................... G02B 3/0056 348/360 |
| 2010/0321595 A1 | 12/2010 | Chiu et al. |
| 2011/0001037 A1 | 1/2011 | Tewinkle |
| 2011/0018973 A1 | 1/2011 | Takayama |
| 2011/0019243 A1 | 1/2011 | Constant, Jr. et al. |
| 2011/0031381 A1* | 2/2011 | Tay et al. ...................... 250/226 |
| 2011/0032370 A1 | 2/2011 | Ludwig |
| 2011/0043661 A1 | 2/2011 | Podoleanu |
| 2011/0043665 A1 | 2/2011 | Ogasahara |
| 2011/0043668 A1 | 2/2011 | McKinnon et al. |
| 2011/0044502 A1 | 2/2011 | Liu et al. |
| 2011/0051255 A1 | 3/2011 | Lee et al. |
| 2011/0069189 A1 | 3/2011 | Venkataraman et al. |
| 2011/0080487 A1 | 4/2011 | Venkataraman et al. |
| 2011/0108708 A1 | 5/2011 | Olsen et al. |
| 2011/0121421 A1 | 5/2011 | Charbon et al. |
| 2011/0122308 A1 | 5/2011 | Duparre |
| 2011/0128393 A1 | 6/2011 | Tavi et al. |
| 2011/0128412 A1 | 6/2011 | Milnes et al. |
| 2011/0149408 A1 | 6/2011 | Hahgholt et al. |
| 2011/0149409 A1 | 6/2011 | Haugholt et al. |
| 2011/0153248 A1 | 6/2011 | Gu et al. |
| 2011/0157321 A1 | 6/2011 | Nakajima et al. |
| 2011/0176020 A1 | 7/2011 | Chang |
| 2011/0181797 A1 | 7/2011 | Galstian et al. |
| 2011/0211824 A1 | 9/2011 | Georgiev et al. |
| 2011/0221599 A1 | 9/2011 | Högasten |
| 2011/0221658 A1 | 9/2011 | Haddick et al. |
| 2011/0221939 A1 | 9/2011 | Jerdev |
| 2011/0221950 A1 | 9/2011 | Oostra |
| 2011/0228144 A1* | 9/2011 | Tian et al. ..................... 348/243 |
| 2011/0234841 A1 | 9/2011 | Akeley et al. |
| 2011/0241234 A1 | 10/2011 | Duparre |
| 2011/0242342 A1 | 10/2011 | Goma et al. |
| 2011/0242355 A1 | 10/2011 | Goma et al. |
| 2011/0242356 A1 | 10/2011 | Aleksic |
| 2011/0255592 A1 | 10/2011 | Sung et al. |
| 2011/0255745 A1 | 10/2011 | Hodder et al. |
| 2011/0261993 A1 | 10/2011 | Weiming et al. |
| 2011/0267348 A1 | 11/2011 | Lin et al. |
| 2011/0273531 A1 | 11/2011 | Ito et al. |
| 2011/0274366 A1 | 11/2011 | Tardif |
| 2011/0279721 A1 | 11/2011 | McMahon |
| 2011/0285866 A1 | 11/2011 | Bhrugumalla et al. |
| 2011/0298917 A1 | 12/2011 | Yanagita |
| 2011/0300929 A1 | 12/2011 | Tardif et al. |
| 2011/0310980 A1 | 12/2011 | Mathew |
| 2011/0317766 A1 | 12/2011 | Lim, II et al. |
| 2012/0012748 A1 | 1/2012 | Pain et al. |
| 2012/0026297 A1 | 2/2012 | Sato |
| 2012/0026342 A1 | 2/2012 | Yu et al. |
| 2012/0026451 A1 | 2/2012 | Nystrom |
| 2012/0039525 A1 | 2/2012 | Tian et al. |
| 2012/0044249 A1 | 2/2012 | Mashitani et al. |
| 2012/0044372 A1 | 2/2012 | Côté et al. |
| 2012/0062702 A1 | 3/2012 | Jiang et al. |

(56) References Cited

U.S. PATENT DOCUMENTS

| | | |
|---|---|---|
| 2012/0069235 A1 | 3/2012 | Imai |
| 2012/0105691 A1 | 5/2012 | Waqas et al. |
| 2012/0113318 A1 | 5/2012 | Galstian et al. |
| 2012/0113413 A1 | 5/2012 | Miahczylowicz-Wolski et al. |
| 2012/0147139 A1 | 6/2012 | Li et al. |
| 2012/0147205 A1 | 6/2012 | Lelescu et al. |
| 2012/0153153 A1 | 6/2012 | Chang et al. |
| 2012/0154551 A1 | 6/2012 | Inoue |
| 2012/0163672 A1 | 6/2012 | McKinnon et al. |
| 2012/0169433 A1 | 7/2012 | Mullins |
| 2012/0170134 A1 | 7/2012 | Bolis et al. |
| 2012/0176479 A1 | 7/2012 | Mayhew et al. |
| 2012/0188389 A1 | 7/2012 | Lin et al. |
| 2012/0188420 A1 | 7/2012 | Black et al. |
| 2012/0188634 A1 | 7/2012 | Kubala et al. |
| 2012/0198677 A1 | 8/2012 | Duparre |
| 2012/0200734 A1 | 8/2012 | Tang |
| 2012/0229628 A1 | 9/2012 | Ishiyama et al. |
| 2012/0249550 A1 | 10/2012 | Akeley et al. |
| 2012/0249750 A1 | 10/2012 | Izzat et al. |
| 2012/0249836 A1 | 10/2012 | Ali et al. |
| 2012/0262607 A1 | 10/2012 | Shimura et al. |
| 2012/0268574 A1 | 10/2012 | Gidon et al. |
| 2012/0287291 A1 | 11/2012 | McMahon et al. |
| 2012/0293695 A1 | 11/2012 | Tanaka |
| 2012/0307099 A1* | 12/2012 | Yahata .................. 348/222.1 |
| 2012/0314033 A1 | 12/2012 | Lee et al. |
| 2012/0327222 A1 | 12/2012 | Ng et al. |
| 2013/0002828 A1 | 1/2013 | Ding et al. |
| 2013/0003184 A1 | 1/2013 | Duparre |
| 2013/0010073 A1 | 1/2013 | Do |
| 2013/0016885 A1 | 1/2013 | Tsujimoto et al. |
| 2013/0022111 A1 | 1/2013 | Chen et al. |
| 2013/0027580 A1 | 1/2013 | Olsen et al. |
| 2013/0033579 A1 | 2/2013 | Wajs |
| 2013/0033585 A1 | 2/2013 | Li et al. |
| 2013/0050504 A1 | 2/2013 | Safaee-Rad et al. |
| 2013/0050526 A1 | 2/2013 | Keelan |
| 2013/0057710 A1 | 3/2013 | McMahon |
| 2013/0070060 A1 | 3/2013 | Chatterjee |
| 2013/0076967 A1 | 3/2013 | Brunner et al. |
| 2013/0077880 A1 | 3/2013 | Venkataraman et al. |
| 2013/0077882 A1 | 3/2013 | Venkataraman et al. |
| 2013/0088489 A1 | 4/2013 | Schmeitz et al. |
| 2013/0088637 A1 | 4/2013 | Duparre |
| 2013/0113899 A1 | 5/2013 | Morohoshi et al. |
| 2013/0120605 A1 | 5/2013 | Georgiev et al. |
| 2013/0128068 A1 | 5/2013 | Georgiev et al. |
| 2013/0128069 A1 | 5/2013 | Georgiev et al. |
| 2013/0128087 A1 | 5/2013 | Georgiev et al. |
| 2013/0128121 A1 | 5/2013 | Agarwala et al. |
| 2013/0147979 A1 | 6/2013 | McMahon et al. |
| 2013/0215108 A1 | 8/2013 | McMahon et al. |
| 2013/0215231 A1* | 8/2013 | Hiramoto et al. .............. 348/46 |
| 2013/0222556 A1 | 8/2013 | Shimada |
| 2013/0223759 A1 | 8/2013 | Nishiyama et al. |
| 2013/0229540 A1 | 9/2013 | Farina et al. |
| 2013/0259317 A1 | 10/2013 | Gaddy |
| 2013/0265459 A1 | 10/2013 | Duparre et al. |
| 2013/0274923 A1 | 10/2013 | By et al. |
| 2013/0293760 A1 | 11/2013 | Nisenzon et al. |
| 2014/0009586 A1 | 1/2014 | McNamer et al. |
| 2014/0037137 A1 | 2/2014 | Broaddus et al. |
| 2014/0037140 A1 | 2/2014 | Benhimane et al. |
| 2014/0043507 A1* | 2/2014 | Wang et al. .................. 348/267 |
| 2014/0076336 A1 | 3/2014 | Clayton et al. |
| 2014/0079336 A1* | 3/2014 | Venkataraman et al. ..... 382/275 |
| 2014/0092281 A1 | 4/2014 | Nisenzon et al. |
| 2014/0104490 A1 | 4/2014 | Hsieh et al. |
| 2014/0118493 A1 | 5/2014 | Sali et al. |
| 2014/0132810 A1 | 5/2014 | McMahon |
| 2014/0146201 A1* | 5/2014 | Knight et al. ........... 348/231.99 |
| 2014/0176592 A1 | 6/2014 | Wilburn et al. |
| 2014/0192253 A1 | 7/2014 | Laroia |
| 2014/0198188 A1 | 7/2014 | Izawa |
| 2014/0204183 A1* | 7/2014 | Lee et al. .................. 348/49 |
| 2014/0218546 A1 | 8/2014 | Mcmahon |
| 2014/0232822 A1 | 8/2014 | Venkataraman et al. |
| 2014/0240528 A1 | 8/2014 | Venkataraman et al. |
| 2014/0240529 A1 | 8/2014 | Venkataraman et al. |
| 2014/0253738 A1 | 9/2014 | Mullis |
| 2014/0267243 A1* | 9/2014 | Venkataraman et al. ..... 345/419 |
| 2014/0267286 A1 | 9/2014 | Duparre |
| 2014/0267633 A1 | 9/2014 | Venkataraman et al. |
| 2014/0267762 A1 | 9/2014 | Mullis et al. |
| 2014/0267890 A1 | 9/2014 | Lelescu et al. |
| 2014/0285675 A1 | 9/2014 | Mullis |
| 2014/0313315 A1 | 10/2014 | Shoham et al. |
| 2014/0321712 A1 | 10/2014 | Ciurea et al. |
| 2014/0333731 A1 | 11/2014 | Venkataraman et al. |
| 2014/0333764 A1 | 11/2014 | Venkataraman et al. |
| 2014/0333787 A1 | 11/2014 | Venkataraman et al. |
| 2014/0340539 A1 | 11/2014 | Venkataraman et al. |
| 2014/0347509 A1 | 11/2014 | Venkataraman et al. |
| 2014/0347748 A1 | 11/2014 | Duparre |
| 2014/0354773 A1 | 12/2014 | Venkataraman et al. |
| 2014/0354843 A1 | 12/2014 | Venkataraman et al. |
| 2014/0354844 A1 | 12/2014 | Venkataraman et al. |
| 2014/0354853 A1 | 12/2014 | Venkataraman et al. |
| 2014/0354854 A1 | 12/2014 | Venkataraman et al. |
| 2014/0354855 A1 | 12/2014 | Venkataraman et al. |
| 2014/0355870 A1 | 12/2014 | Venkataraman et al. |
| 2014/0368662 A1 | 12/2014 | Venkataraman et al. |
| 2014/0368683 A1 | 12/2014 | Venkataraman et al. |
| 2014/0368684 A1 | 12/2014 | Venkataraman et al. |
| 2014/0368685 A1 | 12/2014 | Venkataraman et al. |
| 2014/0368686 A1 | 12/2014 | Duparre |
| 2014/0369612 A1 | 12/2014 | Venkataraman et al. |
| 2014/0369615 A1 | 12/2014 | Venkataraman et al. |
| 2014/0376825 A1 | 12/2014 | Venkataraman et al. |
| 2014/0376826 A1 | 12/2014 | Venkataraman et al. |
| 2015/0003752 A1 | 1/2015 | Venkataraman et al. |
| 2015/0003753 A1 | 1/2015 | Venkataraman et al. |
| 2015/0009353 A1 | 1/2015 | Venkataraman et al. |
| 2015/0009354 A1 | 1/2015 | Venkataraman et al. |
| 2015/0009362 A1 | 1/2015 | Venkataraman et al. |
| 2015/0015669 A1 | 1/2015 | Venkataraman et al. |
| 2015/0035992 A1 | 2/2015 | Mullis |
| 2015/0036014 A1 | 2/2015 | Lelescu et al. |
| 2015/0036015 A1 | 2/2015 | Lelescu et al. |
| 2015/0042766 A1 | 2/2015 | Ciurea et al. |
| 2015/0042767 A1 | 2/2015 | Ciurea et al. |
| 2015/0042833 A1 | 2/2015 | Lelescu et al. |
| 2015/0049915 A1 | 2/2015 | Ciurea et al. |
| 2015/0049916 A1 | 2/2015 | Ciurea et al. |
| 2015/0049917 A1 | 2/2015 | Ciurea et al. |
| 2015/0055884 A1 | 2/2015 | Venkataraman et al. |
| 2015/0091900 A1 | 4/2015 | Yang et al. |
| 2015/0122411 A1 | 5/2015 | Rodda et al. |
| 2015/0124113 A1 | 5/2015 | Rodda et al. |
| 2015/0124151 A1 | 5/2015 | Rodda et al. |
| 2015/0296137 A1 | 10/2015 | Duparre et al. |

FOREIGN PATENT DOCUMENTS

| | | |
|---|---|---|
| CN | 101427372 A | 5/2009 |
| CN | 101606086 A | 12/2009 |
| EP | 840502 A2 | 5/1998 |
| EP | 1201407 A2 | 5/2002 |
| EP | 1734766 A2 | 12/2006 |
| EP | 2104334 A1 | 9/2009 |
| EP | 2336816 A2 | 6/2011 |
| JP | 59-025483 | 9/1984 |
| JP | 64-037177 | 7/1989 |
| JP | 02-285772 A | 11/1990 |
| JP | 11142609 A | 5/1999 |
| JP | 11223708 A | 8/1999 |
| JP | 2000209503 A | 7/2000 |
| JP | 2001277260 A | 10/2001 |
| JP | 2002195910 A | 7/2002 |
| JP | 2002205310 A | 7/2002 |
| JP | 2002252338 A | 9/2002 |
| JP | 2003094445 A | 4/2003 |
| JP | 2003139910 A | 5/2003 |

(56) References Cited

FOREIGN PATENT DOCUMENTS

| | | |
|---|---|---|
| JP | 2003163938 A | 6/2003 |
| JP | 2004221585 A | 8/2004 |
| JP | 2005116022 A | 4/2005 |
| JP | 2005181460 A | 7/2005 |
| JP | 2005295381 A | 10/2005 |
| JP | 2006033493 A | 2/2006 |
| JP | 2006047944 A | 2/2006 |
| JP | 2006258930 A | 9/2006 |
| JP | 2007520107 A | 7/2007 |
| JP | 2008039852 A | 2/2008 |
| JP | 2008055908 A | 3/2008 |
| JP | 2008507874 A | 3/2008 |
| JP | 2008258885 A | 10/2008 |
| JP | 2009132010 A | 6/2009 |
| JP | 2011017764 A | 1/2011 |
| JP | 2011109484 A | 6/2011 |
| JP | 2013526801 A | 6/2013 |
| JP | 2014521117 A | 8/2014 |
| KR | 1020110097647 A | 8/2011 |
| TW | 200939739 A | 9/2009 |
| WO | 2007083579 A1 | 7/2007 |
| WO | 2008108271 A1 | 9/2008 |
| WO | 2008108926 A1 | 9/2008 |
| WO | 2008150817 A1 | 12/2008 |
| WO | 2009151903 A2 | 12/2009 |
| WO | 2009157273 A1 | 12/2009 |
| WO | 2011008443 A2 | 1/2011 |
| WO | 2011055655 A1 | 5/2011 |
| WO | 2011063347 A2 | 5/2011 |
| WO | 2011116203 A1 | 9/2011 |
| WO | 2011063347 A3 | 10/2011 |
| WO | 2011143501 A1 | 11/2011 |
| WO | 2012057619 A1 | 5/2012 |
| WO | 2012057620 A2 | 5/2012 |
| WO | 2012057621 A1 | 5/2012 |
| WO | 2012057622 A1 | 5/2012 |
| WO | 2012057623 A1 | 5/2012 |
| WO | 2012057620 A3 | 6/2012 |
| WO | 2012074361 A1 | 6/2012 |
| WO | 2012078126 A1 | 6/2012 |
| WO | 2012082904 A1 | 6/2012 |
| WO | 2012155119 A1 | 11/2012 |
| WO | 2013003276 A1 | 1/2013 |
| WO | 2013043751 A1 | 3/2013 |
| WO | 2013043761 A1 | 3/2013 |
| WO | 2013049699 A1 | 4/2013 |
| WO | 2013055960 A1 | 4/2013 |
| WO | 2013119706 A1 | 8/2013 |
| WO | 2013126578 A1 | 8/2013 |
| WO | 2014052974 A2 | 4/2014 |
| WO | 2014032020 A3 | 5/2014 |
| WO | 2014078443 A1 | 5/2014 |
| WO | 2014130849 A1 | 8/2014 |
| WO | 2014133974 A1 | 9/2014 |
| WO | 2014138695 A1 | 9/2014 |
| WO | 2014138697 A1 | 9/2014 |
| WO | 2014144157 A1 | 9/2014 |
| WO | 2014145856 A1 | 9/2014 |
| WO | 2014149403 A1 | 9/2014 |
| WO | 2014150856 A1 | 9/2014 |
| WO | 2014159721 A1 | 10/2014 |
| WO | 2014159779 A1 | 10/2014 |
| WO | 2014160142 A1 | 10/2014 |
| WO | 2014164550 A2 | 10/2014 |
| WO | 2014164909 A1 | 10/2014 |
| WO | 2014165244 A1 | 10/2014 |
| WO | 2014133974 A9 | 4/2015 |
| WO | 2015048694 A2 | 4/2015 |

OTHER PUBLICATIONS

US 8,964,053, 02/2015, Venkataraman et al. (withdrawn)
US 8,965,058, 02/2015, Venkataraman et al. (withdrawn)
US 9,014,491, 04/2015, Venkataraman et al. (withdrawn)

Duparre et al., "Artificial compound eye zoom camera", Bioinspiration & Biomimetics, 2008vol. 3, pp. 1-6.
Duparre et al., "Artificial compound eyes—different concepts and their application to ultra flat image acquisition sensors", MOEMS and Miniaturized Systems IV, Proc. SPIE 5346, Jan. 2004, pp. 89-100.
Duparre et al., "Chirped arrays of refractive ellipsoidal microlenses for aberration correction under oblique incidence", Optics Express, Dec. 26, 2005, vol. 13, No. 26, pp. 10539-10551.
Duparre et al., "Micro-optical artificial compound eyes", Bioinspiration & Biomimetics, 2006, vol. 1, pp. R1-R16.
Duparre et al., "Microoptical artificial compound eyes—from design to experimental verification of two different concepts", Proc. of SPIE, Optical Design and Engineering II, vol. 5962, pp. 59622A-1-59622A-12.
Duparre et al., "Microoptical Artificial Compound Eyes—Two Different Concepts for Compact Imaging Systems", 11th Microoptics Conference, Oct. 30-Nov. 2, 2005, 2 pgs.
Duparre et al., "Microoptical telescope compound eye", Optics Express, Feb. 7, 2005, vol. 13, No. 3, pp. 889-903.
Duparre et al., "Micro-optically fabricated artificial apposition compound eye", Electronic Imaging—Science and Technology, Prod. SPIE 5301, Jan. 2004, pp. 25-33.
Duparre et al., "Novel Optics/Micro-Optics for Miniature Imaging Systems", Proc. of SPIE, 2006, vol. 6196, pp. 619607-1-619607-15.
Duparre et al., "Theoretical analysis of an artificial superposition compound eye for application in ultra flat digital image acquisition devices", Optical Systems Design, Proc. SPIE 5249, Sep. 2003, pp. 408-418.
Duparre et al., "Thin compound-eye camera", Applied Optics, May 20, 2005, vol. 44, No. 15, pp. 2949-2956.
Duparre et al., "Ultra-Thin Camera Based on Artificial Apposistion Compound Eyes", 10th Microoptics Conference, Sep. 1-3, 2004, 2 pgs.
Fanaswala, "Regularized Super-Resolution of Multi-View Images", Retrieved on Nov. 10, 2012. Retrieved from the Internet at URL:<http://www.site.uottawa.ca/-edubois/theses/Fanaswala_thesis.pdf>, 163 pgs.
Farrell et al., "Resolution and Light Sensitivity Tradeoff with Pixel Size", Proceedings of the SPIE Electronic Imaging 2006 Conference, 2006, vol. 6069, 8 pgs.
Farsiu et al., "Advances and Challenges in Super-Resolution", International Journal of Imaging Systems and Technology, 2004, vol. 14, pp. 47-57.
Farsiu et al., "Fast and Robust Multiframe Super Resolution", IEEE Transactions on Image Processing, Oct. 2004, vol. 13, No. 10, pp. 1327-1344.
Farsiu et al., "Multiframe Demosaicing and Super-Resolution of Color Images", IEEE Transactions on Image Processing, Jan. 2006, vol. 15, No. 1, pp. 141-159.
Feris et al., "Multi-Flash Stereopsis: Depth Edge Preserving Stereo with Small Baseline Illumination", IEEE Trans on PAMI, 2006, 31 pgs.
Fife et al., "A 3D Multi-Aperture Image Sensor Architecture", Custom Integrated Circuits Conference, 2006, CICC '06, IEEE, pp. 281-284.
Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.
Fischer, et al. , "Optical System Design", 2nd Edition, SPIE Press, pp. 191-198.
Fischer, et al. , "Optical System Design", 2nd Edition, SPIE Press, pp. 49-58.
Goldman et al., "Video Object Annotation, Navigation, and Composition", In Proceedings of UIST 2008, pp. 3-12.
Gortler et al., "The Lumigraph", In Proceedings of SIGGRAPH 1996, pp. 43-54.
Hacohen et al., "Non-Rigid Dense Correspondence with Applications for Image Enhancement", ACM Transactions on Graphics, 30, 4, 2011, pp. 70:1-70:10.
Hamilton, "JPEG File Interchange Format, Version 1.02", Sep. 1, 1992, 9 pgs.

(56) References Cited

OTHER PUBLICATIONS

Hardie, "A Fast Image Super-Algorithm Using an Adaptive Wiener Filter", IEEE Transactions on Image Processing, Dec. 2007, vol. 16, No. 12, pp. 2953-2964.
Hasinoff et al., "Search-and-Replace Editing for Personal Photo Collections", Computational Photography (ICCP) 2010, pp. 1-8.
Horisaki et al., "Irregular Lens Arrangement Design to Improve Imaging Performance of Compound-Eye Imaging Systems", Applied Physics Express, 2010, vol. 3, pp. 022501-1-022501-3.
Horisaki et al., "Superposition Imaging for Three-Dimensionally Space-Invariant Point Spread Functions", Applied Physics Express, 2011, vol. 4, pp. 112501-1-112501-3.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Jarabo et al., "Efficient Propagation of Light Field Edits", In Proceedings of SIACG 2011, pp. 75-80.
Joshi, et al., "Synthetic Aperture Tracking: Tracking Through Occlusions", ICCV IEEE 11th International Conference on Computer Vision; Publication [online]. Oct. 2007 [retrieved Jul. 28, 2014]. Retrieved from the Internet: http:l/ieeexplore.ieee.org/stamp/stamp.jsp?tp=&arnumber=4409032&isnumber=4408819>; pp. 1-8.
Kang et al., "Handling Occlusions inn Dense Multi-View Stereo", Computer Vision and Pattern Recognition, 2001, vol. 1, pp. I-103-I-110.
Kitamura et al., "Reconstruction of a high-resolution image on a compound-eye image-capturing system", Applied Optics, Mar. 10, 2004, vol. 43, No. 8, pp. 1719-1727.
Krishnamurthy et al., "Compression and Transmission of Depth Maps for Image-Based Rendering", Image Processing, 2001, pp. 828-831.
Kutulakos et al., "Occluding Contour Detection Using Affine Invariants and Purposive Viewpoint Control", Proc., CVPR 94, 8 pgs.
Lai et al., "A Large-Scale Hierarchical Multi-View RGB-D Object Dataset", source and date unknown, 8 pgs.
Lee et al., "Electroactive Polymer Actuator for Lens-Drive Unit in Auto-Focus Compact Camera Module", ETRI Journal, vol. 31, No. 6, Dec. 2009, pp. 695-702.
LensVector, "How LensVector Autofocus Works", printed Nov. 2, 2012 from http://www.lensvector.com/overview.html, 1 pg.
Levin et al., "A Closed Form Solution to Natural Image Matting", Pattern Analysis and Machine Intelligence, Feb. 2008, vol. 30, 8 pgs.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Li et al., "A Hybrid Camera for Motion Deblurring and Depth Map Super-Resolution", Jun. 23-28, 2008, IEEE Conference on Computer Vision and Pattern Recognition, 8 pgs. Retrieved from www.eecis.udel.edu/~jye/lab_research/08/deblur-feng.pdf on Feb. 5, 2014.
Liu et al., "Virtual View Reconstruction Using Temporal Information", 2012 IEEE International Conference on Multimedia and Expo, 2012, pp. 115-120.
Lo et al., "Stereoscopic 3D Copy & Paste", ACM Transactions on Graphics, vol. 29, No. 6, Article 147, Dec. 2010, pp. 147:1-147:10.
Mitra et al., "Light Field Denoising, Light Field Superresolution and Stereo Camera Based Refocussing using a GMM Light Field Patch Prior", Computer Vision and Pattern Recognition Workshops (CVPRW), 2012 IEEE Computer Society Conference on Jun. 16-21, 2012, pp. 22-28.
Moreno-Noguer et al., "Active Refocusing of Images and Videos", ACM SIGGRAPH, 2007, vol. 26, pp. 1-10, [retrieved on Jul. 8, 2015], Retrieved from the Internet <U RL:http://doi.acm.org/1 0.1145/1276377.1276461 >.
Muehlebach, "Camera Auto Exposure Control for VSLAM Applications", Studies on Mechatronics, Swiss Federal Institute of Technology Zurich, Autumn Term 2010 course, 67 pgs.

Nayar, "Computational Cameras: Redefining the Image", IEEE Computer Society, Aug. 2006, pp. 30-38.
Ng, "Digital Light Field Photography", Thesis, Jul. 2006, 203 pgs.
Ng et al., "Super-Resolution Image Restoration from Blurred Low-Resolution Images", Journal of Mathematical Imaging and Vision, 2005, vol. 23, pp. 367-378.
Nitta et al., "Image reconstruction for thin observation module by bound optics by using the iterative backprojection method", Applied Optics, May 1, 2006, vol. 45, No. 13, pp. 2893-2900.
Nomura et al., "Scene Collages and Flexible Camera Arrays", Proceedings of Eurographics Symposium on Rendering, 2007, 12 pgs.
Park et al., "Super-Resolution Image Reconstruction", IEEE Signal Processing Magazine, May 2003, pp. 21-36.
Perwass et al., "Single Lens 3D-Camera with Extended Depth-of-Field", printed from www.raytrix.de, 15 pgs.
Pham et al., "Robust Super-Resolution without Regularization", Journal of Physics: Conference Series 124, 2008, pp. 1-19.
Polight, "Designing Imaging Products Using Reflowable Autofocus Lenses", http://www.polight.no/tunable-polymer-autofocus-lens-html--11.html.
Pouydebasquea et al., "Varifocal liquid lenses with integrated actuator, high focusing power and low operating voltage fabricated on 200 mm wafers", Sensors and Actuators A: Physical, vol. 172, Issue 1, Dec. 2011, pp. 280-286.
Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Randeret al., "Virtualized Reality: Constructing Time-Varying Virtual Worlds From Real World Events", Proc. of IEEE Visualization '97, Phoenix, Arizona, Oct. 19-24, 1997, pp. 277-283, 552.
Rhemann et al, "Fast Cost-Volume Filtering for Visual Correspondence and Beyond", IEEE Trans. Pattern Anal. Mach. Intell, 2013, vol. 35, No. 2, pp. 504-511.
Robertson et al., "Dynamic Range Improvement Through Multiple Exposures", In Proc. of the Int. Conf. on Image Processing, 1999, 5 pgs.
Robertson et al., "Estimation-theoretic approach to dynamic range enhancement using multiple exposures", Journal of Electronic Imaging, Apr. 2003, vol. 12, No. 2, pp. 219-228.
Roy et al., "Non-Uniform Hierarchical Pyramid Stereo for Large Images", Computer and Robot Vision, 2007, pp. 208-215.
Sauer et al., "Parallel Computation of Sequential Pixel Updates in Statistical Tomographic Reconstruction", ICIP 1995, pp. 93-96.
Seitz et al., "Plenoptic Image Editing", International Journal of Computer Vision 48, 2, pp. 115-129.
Shum et al., "Pop-Up Light Field: An Interactive Image-Based Modeling and Rendering System", Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5.
Stollberg et al., "The Gabor superlens as an alternative wafer-level camera approach inspired by superposition compound eyes of nocturnal insects", Optics ExpressAug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tallon et al., "Upsampling and Denoising of Depth Maps via Joint-Segmentation", 20th European Signal Processing Conference, Aug. 27-31, 2012, 5 pgs.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.

(56) References Cited

OTHER PUBLICATIONS

Taylor, "Virtual camera movement: The way of the future?", American Cinematographer 77, 9 (Sept.), 93-100.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Veilleux, "CCD Gain Lab: The Theory", University of Maryland, College Park—Observational Astronomy (ASTR 310), Oct. 19, 2006, pp. 1-5 (online), [retrieved on May 13, 2014]. Retrieved from the Internet <URL: http://www.astro.umd.edu/~veilleux/ASTR310/fall06/ccd_theory.pdf, 5 pgs.
Vuong et al., "A New Auto Exposure and Auto White-Balance Algorithm to Detect High Dynamic Range Conditions Using CMOS Technology", Proceedings of the World Congress on Engineering and Computer Science 2008, WCECS 2008, Oct. 22-24, 2008.
Wang, "Calculation of Image Position, Size and Orientation Using First Order Properties", 10 pgs.
Wetzstein et al., "Computational Plenoptic Imaging", Computer Graphics Forum, 2011, vol. 30, No. 8, pp. 2397-2426.
Wheeler et al., "Super-Resolution Image Synthesis Using Projections Onto Convex Sets in the Frequency Domain", Proc. SPIE, 2005, 5674, 12 pgs.
Wikipedia, "Polarizing Filter (Photography)", http://en.wikipedia.org/wiki/Polarizing_filter_(photography), 1 pg.
Wilburn, "High Performance Imaging Using Arrays of Inexpensive Cameras", Thesis of Bennett Wilburn, Dec. 2004, 128 pgs.
Wilburn et al., "High Performance Imaging Using Large Camera Arrays", ACM Transactions on Graphics, Jul. 2005, vol. 24, No. 3, pp. 1-12.
Wilburn et al., "High-Speed Videography Using a Dense Camera Array", ProceedingCVPR'04 Proceedings of the 2004 IEEE Computer Society Conference on Computer Vision and Pattern Recognition, pp. 294-301.
Wilburn et al., "The Light Field Video Camera", Proceedings of Media Processors 2002, SPIE Electronic Imaging, 2002, 8 pgs.
Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.
Yang et al., "A Real-Time Distributed Light Field Camera", Eurographics Workshop on Rendering (2002), pp. 1-10.
Yang et al., "Superresolution Using Preconditioned Conjugate Gradient Method", Source and date unknown, 8 pgs.
Zhang et al., "Depth estimation, spatially variant image registration, and super-resolution using a multi-lenslet camera", Proceedings of SPIE, vol. 7705, Apr. 23, 2010, pp. 770505-770505-8, XP055113797 ISSN: 0277-786X, DOI: 10.1117/12.852171.
Zhang et al., "A Self-Reconfigurable Camera Array", Eurographics Symposium on Rendering, 2004, 12 pgs.
Zomet et al., "Robust Super-Resolution", IEEE, 2001, pp. 1-6.
"International Search Report and Written Opinion for International Application PCT/US2014/064693, Completed Mar. 7, 2015, Mailed Apr. 2, 2015, 15 pgs."
Extended European Search Report for European Application EP12782935.6, report completed Aug. 28, 2014 Mailed Sep. 4, 2014, 6 Pgs.
Extended European Search Report for European Application EP12804266.0, Report Completed Jan. 27, 2015, Mailed Feb. 3, 2015, 6 Pgs.
Extended European Search Report for European Application EP12835041.0, Report Completed Jan. 28, 2015, Mailed Feb. 4, 2015, 6 Pgs.
International Preliminary Report on Patentability for International Application No. PCT/US2012/059813, Search Completed Apr. 15, 2014, 7 pgs.
International Preliminary Report on Patentability for International Application No. PCT/US2013/059991, Issued Mar. 17, 2015, Mailed Mar. 26, 2015, 8 pgs.
International Preliminary Report on Patentability for International Application PCT/US13/56065, Report Issued Feb. 24, 2015, Mailed Mar. 5, 2015, 4 Pgs.
International Preliminary Report on Patentability for International Application PCT/US13/62720, Report Issued Mar. 31, 2015, Mailed Apr. 9, 2015, 8 Pgs.
International Preliminary Report on Patentability for International Application PCT/US2013/024987, Mailed Aug. 21, 2014, 13 Pgs.
International Preliminary Report on Patentability for International Application PCT/US2013/027146, Completed Apr. 2, 2013, Issued Aug. 26, 2014, 10 pgs.
International Preliminary Report on Patentability for International Application PCT/US2013/039155, completed Nov. 4, 2014, Mailed Nov. 13, 2014, 10 Pgs.
International Preliminary Report on Patentability for International Application PCT/US2013/046002, issued Dec. 31, 2014, Mailed Jan. 8, 2015, 6 Pgs.
International Preliminary Report on Patentability for International Application PCT/US2013/048772, Report issued Dec. 31, 2014, Mailed Jan. 8, 2015, 8 Pgs.
International Preliminary Report on Patentability for International Application PCT/US2013/056502, Report Issued Feb. 24, 2015, Mailed Mar. 5, 2015, 7 Pgs.
International Preliminary Report on Patentability for International Application PCT/US2013/069932, issued May 19, 2015, Mailed May 28, 2015, 12 Pgs.
International Preliminary Report on Patentability for International Application PCT/US2014/023762, issued Mar. 2, 2015, Mailed Mar. 9, 2015, 10 Pgs.
International Search Report and Written Opinion for International Application No. PCT/US13/46002, completed Nov. 13, 2013, Mailed Nov. 29, 2013, 7 pgs.
International Search Report and Written Opinion for International Application No. PCT/US13/56065, Completed Nov. 25, 2013, Mailed Nov. 26, 2013, 8 pgs.
International Search Report and Written Opinion for International Application No. PCT/US13/59991, Completed Feb. 6, 2014, Mailed Feb. 26, 2014, 8 pgs.
International Search Report and Written Opinion for International Application No. PCT/US2009/044687, completed Jan. 5, 2010, date mailed Jan. 13, 2010, 9 pgs.
International Search Report and Written Opinion for International Application No. PCT/US2011/64921, Completed Feb. 25, 2011, mailed Mar. 6, 2012, 17 pgs.
International Search Report and Written Opinion for International Application No. PCT/US2013/024987, Completed Mar. 27, 2013, Mailed Apr. 15, 2013, 14 pgs.
International Search Report and Written Opinion for International Application No. PCT/US2013/027146, completed Apr. 2, 2013, 12 pgs.
International Search Report and Written Opinion for International Application No. PCT/US2013/039155, completed Jul. 1, 2013, Mailed Jul. 11, 2013, 11 Pgs.
International Search Report and Written Opinion for International Application No. PCT/US2013/048772, Completed Oct. 21, 2013, Nov. 8, 2013, 6 pgs.
International Search Report and Written Opinion for International Application No. PCT/US2013/056502, Completed Feb. 18, 2014, Mar. 19, 2014, 7 pgs.
International Search Report and Written Opinion for International Application No. PCT/US2013/069932, International Filing Date Nov. 13, 2013, Search Completed Mar. 14, 2014, Mailed Apr. 14, 2014, 12 pgs.
International Search Report and Written Opinion for International Application PCT/US11/36349, mailed Aug. 22, 2011, 11 pgs.

(56) References Cited

OTHER PUBLICATIONS

International Search Report and Written Opinion for International Application PCT/US13/62720, report completed Mar. 25, 2014, Mailed Apr. 21, 2014, 9 Pgs.
International Search Report and Written Opinion for International Application PCT/US14/024903 report completed Jun. 12, 2014, Mailed, Jun. 27, 2014, 13 pgs.
International Search Report and Written Opinion for International Application PCT/US14/17766, report completed May 28, 2014, Mailed Jun. 18, 2014, 9 Pgs.
International Search Report and Written Opinion for International Application PCT/US14/18084, report completed May 23, 2014, Mailed Jun. 10, 2014, 12 Pgs.
International Search Report and Written Opinion for International Application PCT/US14/18116, report completed May 13, 2014, Mailed Jun. 2, 2014, 12 Pgs.
International Search Report and Written Opinion for International Application PCT/US14/22118report completed Jun. 9, 2014, Mailed, Jun. 25, 2014, 5 pgs.
International Search Report and Written Opinion for International Application PCT/US14/22774 report completed Jun. 9, 2014, Mailed Jul. 14, 20146 Pgs.
International Search Report and Written Opinion for International Application PCT/US14/24407, report completed Jun. 11, 2014, Mailed Jul. 8, 2014, 9 Pgs.
International Search Report and Written Opinion for International Application PCT/US14/25100report completed Jul. 7, 2014, Mailed Aug. 7, 2014 5 Pgs.
International Search Report and Written Opinion for International Application PCT/US14/25904 report completed Jun. 10, 2014, Mailed Jul. 10, 2014, 6 Pgs.
International Search Report and Written Opinion for International Application PCT/US2010/057661, completed Mar. 9, 2011, 14 pgs.
International Search Report and Written Opinion for International Application PCT/US2012/044014, completed Oct. 12, 2012, 15 pgs.
International Search Report and Written Opinion for International Application PCT/US2012/056151, completed Nov. 14, 2012, 10 pgs.
International Search Report and Written Opinion for International Application PCT/US2012/059813, Report completed Dec. 17, 2012, 8 pgs.
International Search Report and Written Opinion for International Application PCT/US2012/37670, Mailed Jul. 18, 2012, Report Completed Jul. 5, 2012, 9 pgs.
International Search Report and Written Opinion for International Application PCT/US2012/58093, Report completed Nov. 15, 2012, 12 pgs.
International Search Report and Written Opinion for International Application PCT/US2014/022123report completed Jun. 9, 2014, Mailed Jun. 25, 20145 pgs.
International Search Report and Written Opinion for International Application PCT/US2014/024947, Report Completed Jul. 8, 2014, Mailed Aug. 5, 2014, 8 Pgs.
International Search Report and Written Opinion for International Application PCT/US2014/028447report completed Jun. 30, 2014, Mailed Jul. 21, 20148 Pgs.
International Search Report and Written Opinion for International Application PCT/US2014/030692, report completed Jul. 28, 2014, Mailed Aug. 27, 2014, 7 Pages.
International Search Report and Written Opinion for International Application PCT/US2014/066229, Search Completed Mar. 6, 2015, Mailed Mar. 19, 2015, 9 Pgs.
International Search Report and Written Opinion for International Application PCT/US2014/067740, Report Completed Jan. 29, 2015, Mailed Mar. 3, 2015, 10 pgs.
International Search Report and Written Opinion for International Application PCT/US2014/23762, Report Completed May 30, 2014, Mailed Jul. 3, 2014, 6 Pgs.

Office Action for U.S. Appl. No. 12/952,106, dated Aug. 16, 2012, 12 pgs.
Baker et al., "Limits on Super-Resolution and How to Break Them", IEEE Transactions on Pattern Analysis and Machine Intelligence, Sep. 2002, vol. 24, No. 9, pp. 1167-1183.
Bertero et al., "Super-resolution in computational imaging", Micron, 2003, vol. 34, Issues 6-7, 17 pgs.
Bishop et al., "Full-Resolution Depth Map Estimation from an Aliased Plenoptic Light Field", ACCV 2010, Part II, LNCS 6493, pp. 186-200.
Bishop et al., "Light Field Superresolution", Retrieved from http://home.eps.hw.ac.uk/~sz73/ICCP09/LightFieldSuperresolution.pdf, 9 pgs.
Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.
Borman, "Topics in Multiframe Superresolution Restoration", Thesis of Sean Borman, Apr. 2004, 282 pgs.
Borman et al, "Image Sequence Processing", Source unknown, Oct. 14, 2002, 81 pgs.
Borman et al., "Block-Matching Sub-Pixel Motion Estimation from Noisy, Under-Sampled Frames—An Empirical Performance Evaluation", Proc SPIE, Dec. 1998, 3653, 10 pgs.
Borman et al., "Image Resampling and Constraint Formulation for Multi-Frame Super-Resolution Restoration", Proc. SPIE, Jun. 2003, 5016, 12 pgs.
Borman et al., "Linear models for multi-frame super-resolution restoration under non-affine registration and spatially varying PSF", Proc. SPIE, May 2004, vol. 5299, 12 pgs.
Borman et al., "Nonlinear Prediction Methods for Estimation of Clique Weighting Parameters in NonGaussian Image Models", Proc. SPIE, 1998. 3459, 9 pgs.
Borman et al., "Simultaneous Multi-Frame MAP Super-Resolution Video Enhancement Using Spatio-Temporal Priors", Image Processing, 1999, ICIP 99 Proceedings, vol. 3, pp. 469-473.
Borman et al., "Super-Resolution from Image Sequences—A Review", Circuits & Systems, 1998, pp. 374-378.
Bose et al., "Superresolution and Noise Filtering Using Moving Least Squares", IEEE Transactions on Image Processing, date unknown, 21 pgs.
Boye et al., "Comparison of Subpixel Image Registration Algorithms", Proc. of SPIE—IS&T Electronic Imaging, vol. 7246, pp. 72460X-1-72460X-9.
Bruckner et al., "Artificial compound eye applying hyperacuity", Optics Express, Dec. 11, 2006, vol. 14, No. 25, pp. 12076-12084.
Bruckner et al., "Driving microoptical imaging systems towards miniature camera applications", Proc. SPIE, Micro-Optics, 2010, 11 pgs.
Bruckner et al., "Thin wafer-level camera lenses inspired by insect compound eyes", Optics Express, Nov. 22, 2010, vol. 18, No. 24, pp. 24379-24394.
Capel, "Image Mosaicing and Super-resolution", [online], Retrieved on Nov. 10, 2012 Retrieved from the Internet at URL:<http://citeseerx.ist.psu.edu/viewdoc/download?doi=10.1.1.226.2643&rep=repl &type=pdf>, Title pg., abstract, table of contents, pp. 1-263 (269 total pages).
Chan et al., "Extending the Depth of Field in a Compound-Eye Imaging System with Super-Resolution Reconstruction", Proceedings—International Conference on Pattern Recognition, 2006, vol. 3, pp. 623-626.
Chan et al., "Investigation of Computational Compound-Eye Imaging System with Super-Resolution Reconstruction", IEEE, ISASSP 2006, pp. 1177-1180.
Chan et al., "Super-resolution reconstruction in a computational compound-eye imaging system", Multidim Syst Sign Process, 2007, vol. 18, pp. 83-101.
Chen et al., "Interactive deformation of light fields", In Proceedings of SIGGRAPH I3D 2005, pp. 139-146.
Chen et al., "KNN Matting", IEEE Transactions on Pattern Analysis and Machine Intelligence, Sep. 2013, vol. 35, No. 9, pp. 2175-2188.

(56) References Cited

OTHER PUBLICATIONS

Drouin et al., "Fast Multiple-Baseline Stereo with Occlusion", Proceedings of the Fifth International Conference on 3-D Digital Imaging and Modeling, 2005, 8 pgs.
Drouin et al., "Geo-Consistency for Wide Multi-Camera Stereo", Proceedings of the 2005 IEEE Computer Society Conference on Computer Vision and Pattern Recognition, 2005, 8 pgs.
Drouin et al., "Improving Border Localization of Multi-Baseline Stereo Using Border-Cut", International Journal of Computer Vision, Jul. 2009, vol. 83, Issue 3, 8 pgs.
Duparre et al., "Artificial apposition compound eye fabricated by micro-optics technology", Applied Optics, Aug. 1, 2004, vol. 43, No. 22, pp. 4303-4310.
International Preliminary Report on Patentability for International Application PCT/US2014/028447, Report issued Sep. 15, 2015, Mailed Sep. 24, 2015, 7 Pgs.
Rajan, Deepu et al., "Simultaneous Estimation of Super Resolved Scene and Depth Map from Low Resolution Defocused Observations", IEEE Computer Society, vol. 25, No. 9, Sep. 2003, pp. 1-16.

\* cited by examiner

ARRAY CAMERAS AND ARRAY CAMERA MODULES INCLUDING SPECTRAL FILTERS DISPOSED OUTSIDE OF A CONSTITUENT IMAGE SENSOR

CROSS-REFERENCE TO RELATED APPLICATIONS

The current application claims priority to U.S. Provisional Application No. 62/014,021, filed Jun. 18, 2014, the disclosure of which is incorporated herein by reference in its entirety.

FIELD OF THE INVENTION

The present invention generally relates to array cameras and more specifically to array camera modules that include spectral filters disposed within the optical channels of the array camera module.

BACKGROUND

In response to the constraints placed upon a traditional digital camera based upon the camera obscura, a new class of cameras that can be referred to as array cameras has been proposed. Array cameras are characterized in that they include an imager array that has multiple arrays of pixels, where each pixel array is intended to define a focal plane, and each focal plane has a separate lens stack. Typically, each focal plane includes a plurality of rows of pixels that also forms a plurality of columns of pixels, and each focal plane is contained within a region of the imager array that does not contain pixels from another focal plane. An image is typically formed on each focal plane by its respective lens stack. In many instances, the array camera is constructed using an imager array that incorporates multiple focal planes and an optic array of lens stacks. In other configurations, separate image sensors and optical systems can be utilized to form an array camera.

SUMMARY OF THE INVENTION

Systems and methods in accordance with embodiments of the invention implement array cameras and array camera modules that have spectral filters disposed outside of constituent image sensors. In one embodiment, an array camera module includes: a lens stack array including lens elements arranged to form a plurality of optical channels, where each of the optical channels includes a field-of-view that is shifted with respect to the fields-of-views of each other optical channel so that each shift includes a sub-pixel shifted view of the scene, at least one glass substrate located within at least one optical channel, and at least one spectral filter disposed within, or else proximate to, at least one glass substrate within the lens stack array; and an imager array including: a plurality of focal planes, where each focal plane includes a plurality of rows of pixels that also form a plurality of columns of pixels, and where each focal plane does not include pixels from another focal plane.

DETAILED DESCRIPTION

Turning now to the drawings, systems and methods for implementing array cameras and array camera modules that include spectral filters disposed within the optical channels of each of the cameras within the camera array are illustrated. Processes for constructing array cameras using lens stack arrays are described in U.S. Pat. App. Pub. No. 2011/0069189, entitled "Capturing and Processing of Images Using Monolithic Camera Array with Heterogeneous Imagers", to Venkataraman et al. U.S. Pat. App. Pub. No. 2011/0069189 also discloses non-monolithic array cameras including arrays constructed from an array of array cameras. U.S. Pat. App. Pub. No. 2011/0069189 is incorporated herein by reference in its entirety, especially as it pertains to disclosing array camera configurations—both monolithic and non-monolithic—and processes for constructing such array camera configurations. The monolithic array camera modules illustrated in U.S. Pat. App. Pub. No. 2011/0069189 can be constructed from an optic array of lens stacks—each lens stack in the array defining an optical channel—and an imager array including a plurality of focal planes corresponding to the optical channels in the optic array.

The combination of a lens stack and its corresponding focal plane can be understood to be a 'camera module' (as opposed to an 'array camera module'). An imager array can be implemented on an image sensor that includes a plurality of microlenses, each of which are configured to direct light to a single photodiode or similar sensor element. When an imager array is implemented on an image sensor—the terms 'imager array' and 'image sensor' can be interchangeable. Importantly, although a photodiode is referenced, it can be appreciated that that any suitable photodetector may be implemented. For example, PCT Pat. App. No. PCT/US2014/023762 entitled "Array Camera Architecture Implementing Quantum Film Image Sensors" discloses implementing quantum dots and quantum films to enable photodetection. The disclosure of PCT Pat. App. Pub. No. WO/2014/164909 is incorporated by reference in its entirety, especially as it pertains to implementing quantum dots and quantum films within image sensors. Typically, array cameras are configured to capture image data that can be used to form multiple images of a single scene using their constituent camera modules, and process the image data to yield a single image of the scene with improved image properties.

Figure 1:
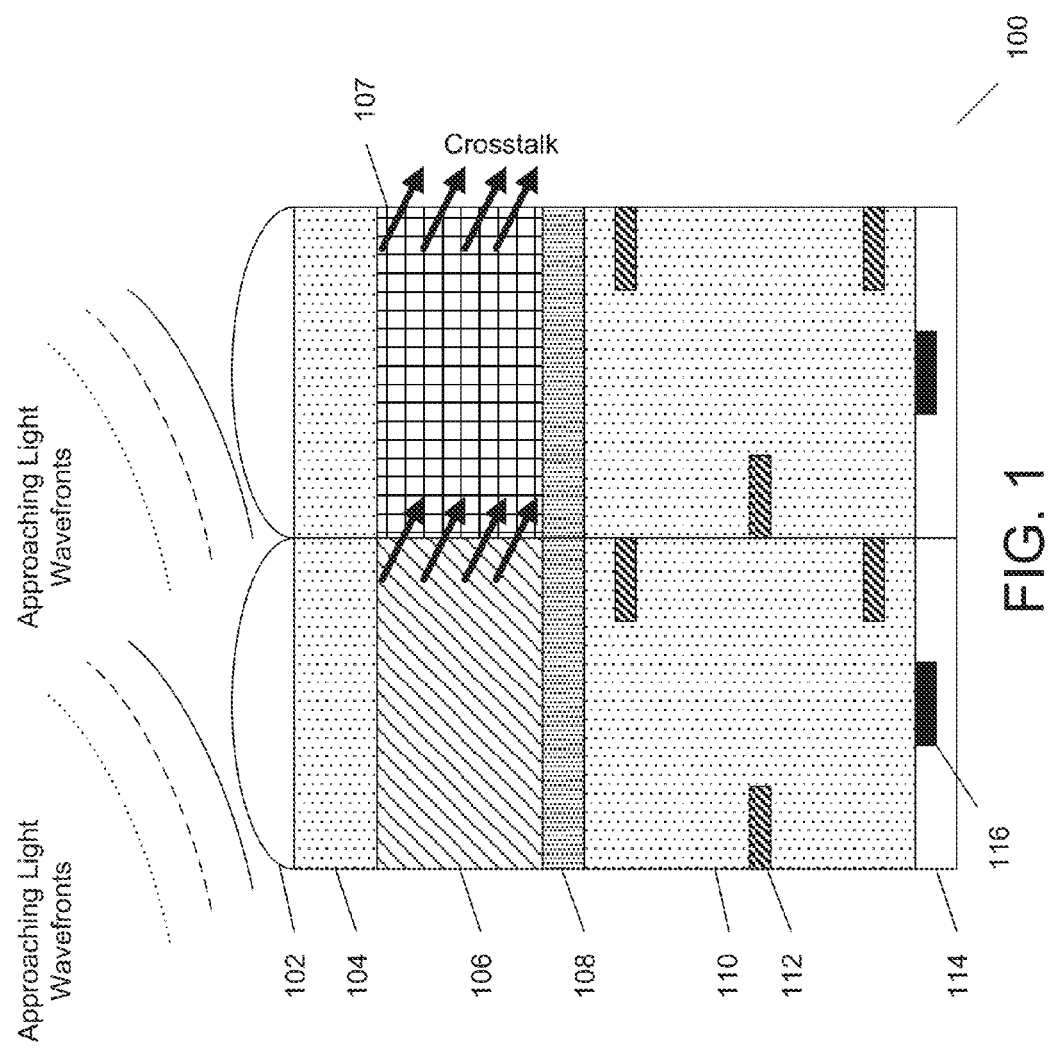
FIG. 1 illustrates a portion of a prior art image sensor that includes spectral filters located within the pixel stacks of the image sensor.

In many instances, array cameras and array camera modules utilize conventional image sensors that include spectral filters. For example, FIG. 1 depicts a portion of a cross-section of a conventional image sensor that can be incorporated within an array camera. In particular, the portion of the cross-section of the image sensor 100 includes microlenses 102, a first oxide layer 104, spectral filters 106 and 107, a nitride layer 108, a second oxide layer 110 including metal interconnects 112 for interfacing with circuitry, and silicon 114 including a photodiode 116. Note that FIG. 1 also depicts crosstalk phenomena. Crosstalk generally regards when light that is intended to be directed exclusively through a particular optical channel—and be received by a particular photodiode (or other photodetector)—undesirably propagates to some extent through to an adjacent optical channel, and is consequently at least partially received by a different photodiode. Crosstalk phenomena is discussed in U.S. Pat. No. 8,514,491, entitled "Capturing and Processing of Images Using Monolithic Camera Array with Heterogenous Imagers," to Duparre. As can be appreciated, crosstalk can result in the degradation of camera performance since pixel values are distorted by the 'leaked' light. The disclosure of U.S. Pat. No. 8,514,491 is hereby incorporated by reference in its entirety, especially as it pertains to array camera configurations, including array camera configurations configured to mitigate crosstalk phenomena and array camera configurations that include lenses whose shape is a function of particular spectral bands, and processes for constructing such array camera configurations.

Accordingly, it is often desirable to reduce crosstalk phenomena. For example, U.S. Pat. No. 8,514,491 discloses using opaque walls to reduce crosstalk. Notably, at the image sensor level, crosstalk phenomena is a function of pixel stack height—the higher the pixel stack, the more likely it is for crosstalk phenomena to have a greater impact. Thus, in many embodiments of the invention, color filters are removed from the image sensor and relocated elsewhere within the array camera or array camera module—this can have the effect of reducing pixel stack height, and thereby reducing the detrimental impact of crosstalk phenomena. For example, in many embodiments, color filters are located within, or proximate, the optic array.

Figure 2:
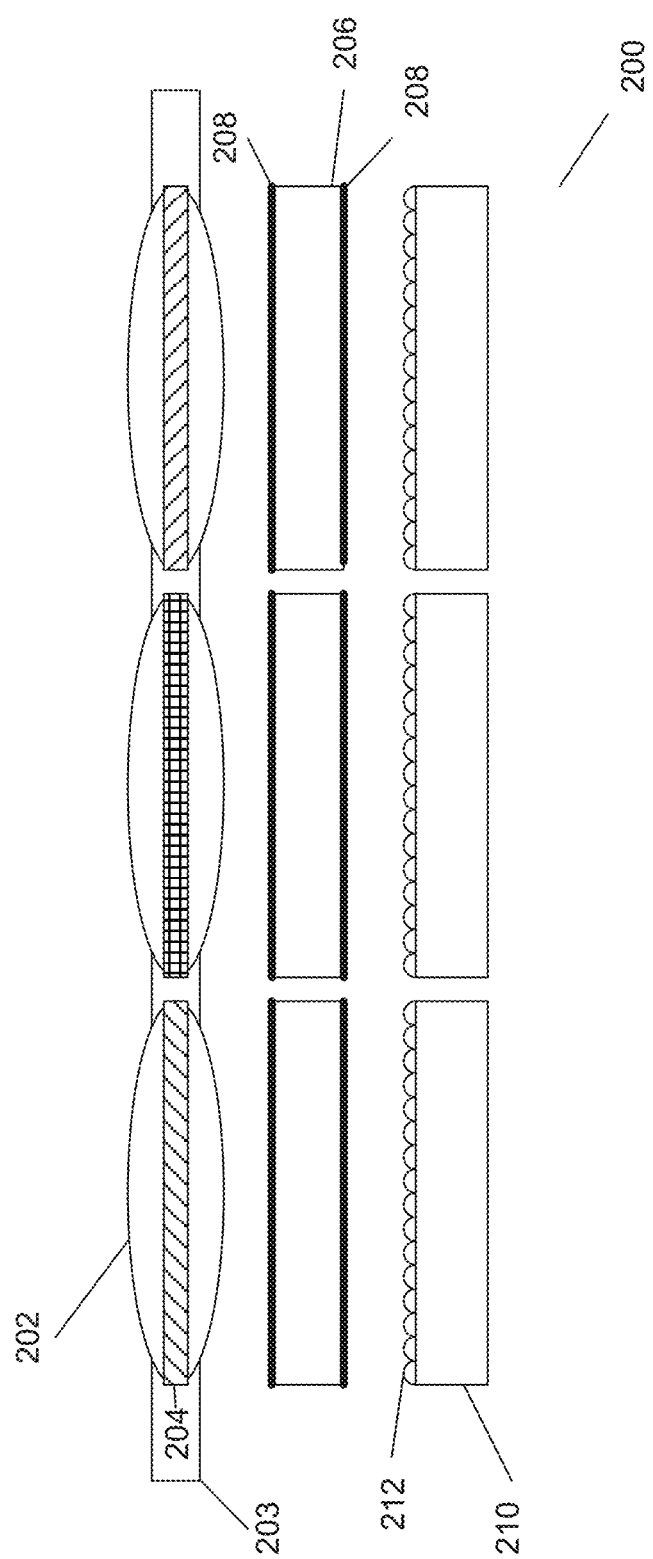
FIG. 2 illustrates a portion of an array camera module that includes spectral filters embedded within its optics.

In many instances, lenses within the optic arrays are fabricated using wafer level optics (WLO) technology. Importantly, WLO technology is amenable to embedding color filters within the fabricated lenses. For example, FIG. 2 depicts a schematic for an array camera module that includes color filters embedded within the optics that were fabricated using wafer level optics technology. In particular, FIG. 2 illustrates an array camera module 200 schematic that includes optics 202 having embedded color filters 204, a cover glass 206 having antireflective coating 208, and an underlying image sensor 210 that includes a microlens array 212; a glass substrate 203 that houses the optics 202 having the embedded color filters 204 is also depicted. However, in many instances, it may be desirable to fabricate the lenses using manufacturing techniques that may not be amenable to embedding color filters within the lenses. For instance, it may be desirable to fabricate the lenses using polymer injection molding and/or precision glass molding. Accordingly, in many embodiments of the invention, color filters are disposed proximate to, or embedded within, a glass substrate that is itself proximate or within an optic array. For example, in many embodiments, color filters are embedded within the sensor cover glass of an array camera module. In this way, array cameras and array camera modules can be manufactured using a great variety of fabrication techniques.

Array cameras and array camera modules that include color filters disposed outside of a constituent image sensor are discussed further below.

Array Camera Architectures

Array cameras in accordance with many embodiments of the invention can include an array camera module and a processor. The array camera module can include an array of camera modules. An array camera module can alternatively be implemented using an imager array, which is a sensor that includes an array of focal planes, and an optic array of lens stacks. Each focal plane can include an array of pixels used to capture an image formed on the focal plane by a lens stack. The focal plane can be formed of, but is not limited to, traditional CIS (CMOS Image Sensor), CCD (charge-coupled device), quantum film image sensors that include quantum dots (e.g. as disclosed in PCT Pat. App. Pub. No. WO/2014/164909), high dynamic range sensor elements, multispectral sensor elements and various alternatives thereof. In many embodiments, the pixels of each focal plane have similar physical properties and receive light through the same lens stack. Furthermore, the pixels in each focal plane may be associated with the same spectral filter. As alluded to above, each pixel can have an associated microlens to direct light to the associated photodiode (or other photodetector). In a number of embodiments, at least one of the focal planes includes a Bayer-pattern filter. Thus, for example, one focal plane can have color filters embedded within the microlenses in a Bayer-pattern, and another focal plane can have a color filter implemented within the optical channel of the array camera module. For example, in many embodiments a single color filter corresponds to a single camera module and is implemented within the optical channel a distance from the image sensor. Thus for example, a 'green camera module' may be implemented where a green color filter is associated with a camera module. Of course, a camera module can be associated with any spectral band (i.e. not just a 'green' spectral band) in accordance with embodiments of the invention.

In several embodiments, the focal planes are independently controlled. In other embodiments, the operation of the focal planes in the imager array is controlled via a single set of controls. Array cameras are discussed in U.S. Pat. App. Pub. No. 2012/0012748 entitled "Architectures for imager arrays and array cameras" and U.S. Pat. No. 8,514,491 entitled "Capturing and processing of images using monolithic camera array with heterogenous imagers" (incorporated by reference above). The disclosure of U.S. Pat. App. Pub. No. 2012/0012748 is hereby incorporated by reference in its entirety, especially as it pertains to array camera architectures and the controlled operation of focal planes.

Figure 3:
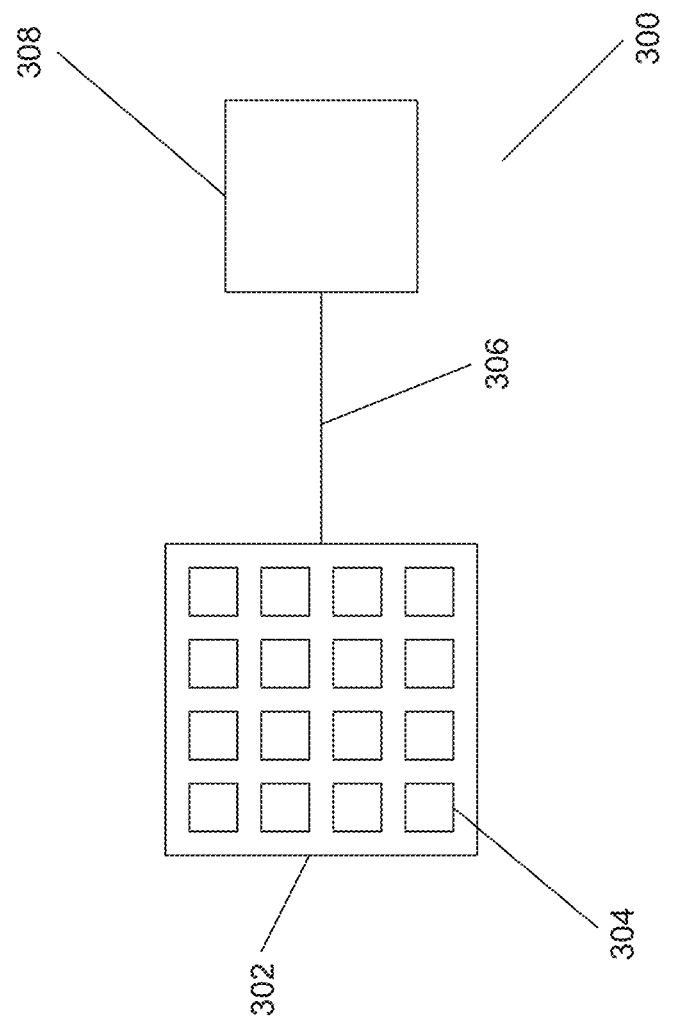
FIG. 3 conceptually illustrates an array camera architecture in accordance with an embodiment of the invention.

An array camera architecture that can be used in a variety of array camera configurations in accordance with embodiments of the invention is illustrated in FIG. 3. The array camera 300 includes an array camera module 302 that is configured to transmit 306 image data to a receiving device 308 via an interface format involving the transmission of additional data describing the transmitted image data. The array camera module 302 includes an array of camera modules 304. The camera modules 304 in the array camera module 302 are formed from the combination of a lens stack and a focal plane. The array camera module 302 can include an optic array of lens stacks and an imager array of focal planes. These multiple camera modules 304 may be active or inactive at any given time. The image data captured by these multiple camera modules may be transmitted from the focal planes of each camera to a processor. The focal planes may have different imaging characteristics, such as varying exposure times, start times, and end times. Therefore, the timing of the transmission of the image data captured by each focal plane can vary. Accordingly, the imager array can transmit additional data describing the image data to enable a device receiving the image data to appropriately reconstruct images from the received image data. The transmission of array camera image data is disclosed in U.S. Pat. No. 8,305,456 entitled "Systems and Methods for Transmitting and Receiving Array Camera Image Data," the disclosure of which is hereby incorporated by reference in its entirety, especially as it relates to the transmission of array camera image data.

In many embodiments, the array camera 300 captures images using a plurality of camera modules 304, which can have different imaging characteristics. The array camera 300 can separately control each of the cameras to obtain enhanced image capture and/or to enhance processes such as (but not limited to) super-resolution processes that may be applied to the captured images. For example, each focal plane (or even each pixel of each focal plane) can be independently configured to capture particular wavelengths of light and/or particular intensities. Additionally, each focal plane can be independently configured so that it implements distinct exposure times and/or start/stop times irrespective of the exposure times and/or start/stop times implemented by other focal planes. Once the array camera 300 has commenced capturing image data using the pixels on the imager array, the focal planes can commence transmitting the image data captured using the pixels to a receiving device 308. The image data captured by different cameras can be interleaved for transmission to a receiving device 308 that includes interface circuitry configured to receive image data. In many embodiments, the interface circuitry is implemented in hardware and/or using a processor. The receiving device 308 can then organize the captured image data from the received packet and appropriately combine the image data to process and/or reconstruct the image(s) captured by one or more of the focal planes in the imager array.

In the illustrated embodiment, image data from multiple images of a scene can be captured by the array camera module 302. As the image data is captured, the array camera module 302 transmits 306 the image data to a receiving device 308. The array camera module 302 transmits the image data using a small number of local data storage cells on the array camera module 302 that store the captured image data following capture by the cameras. In the illustrated embodiment, the array camera module 302 manages the capture and transmission of image data so that the captured image data stored in the storage cells is transmitted by the imager array of the array camera module 302 in the time taken to capture and load the next set of image data into the storage cells. In this way, the array camera module can continuously buffer and transmit image data using a number of local data storage cells that is less than the total number of pixels in the array camera module.

In many embodiments, a line of image data transmitted by an imager array can be considered to equal the number of pixels in a row of a focal plane multiplied by the number of focal planes. In several embodiments, the clock frequency of transmitter circuitry on the imager array is set to a desired output data rate and the internal focal plane pixel rate is set to 1/N the desired output data rate (where N is the total number of focal planes). In many image transmission protocols, once a start of line condition is sent, all of the image data is transmitted without interrupt until the end of line.

Accordingly, a sufficient number of data storage cells and a buffering mechanism can be developed that starts transmission of pixels once there are sufficient pixels stored such that all of the pixels will have been captured and transmitted by the time the end of the line of image data is reached. If, for example, an imager array including 16 focal planes (as in a 4×4 array) transmits image data from all focal planes, then there is very little data storage utilized prior to the start of focal plane readout, because the data is transmitted at approximately the rate that at which it is being read. If, however, the same imager array only has one active imager, then almost all of the pixels from a row of the focal plane are stored since the buffer is being read 16 times as fast as it is being written. Therefore, the data storage requirement would be one row of pixels (i.e. 1/16th of a line of image data). When eight focal planes are active, half the data from all eight focal planes is buffered before transmission commences to avoid underflow. Therefore, the total number of data storage cells utilized is equal to four rows of pixels or one quarter of a line of image data. The above examples illustrate how the data storage requirements of an imager array can vary based upon the number of active focal planes. In many embodiments, the total number of storage cells within an imager array is less than a quarter of a line of image data. In several embodiments, the total number of storage cells within an imager array is equal to a line of image data. In several embodiments, the total number of data storage cells is between a quarter of a line of image data and a full line of image data. In a number of embodiments, the total number of storage cells is equal to or greater than a line of image data. When the array camera module transmits the captured image data, the incorporation of additional data describing the image data enables a peripheral device receiving the image data to reconstruct the images captured by each active camera in the imager array 302.

Imager arrays in accordance with many embodiments of the invention are configured to output image data via an interface format that accommodates the transfer of image data captured via multiple focal planes. In several embodiments, the imager array is configured to transmit captured image data in accordance with an interface format that is compatible with standard interface formats, such as (but not limited to) the MIPI CSI-2 interface format (MIPI interface format), the Camera Link interface format, and any of the Universal Serial Bus (USB) interface formats or FireWire interface formats. When image data captured from multiple focal planes is output by the imager array, the device receiving the image data is faced with the task of assembling the image data into a plurality of images of a scene.

Although specific array camera system architectures are discussed above for constructing array cameras including M×N arrays of cameras, any of a variety of system architectures for array cameras including M×N arrays of cameras can be utilized as appropriate to the requirements of a specific application in accordance with embodiments of the invention. Imager array architectures are discussed below in greater detail.

Imager Array Architectures

Figure 4:
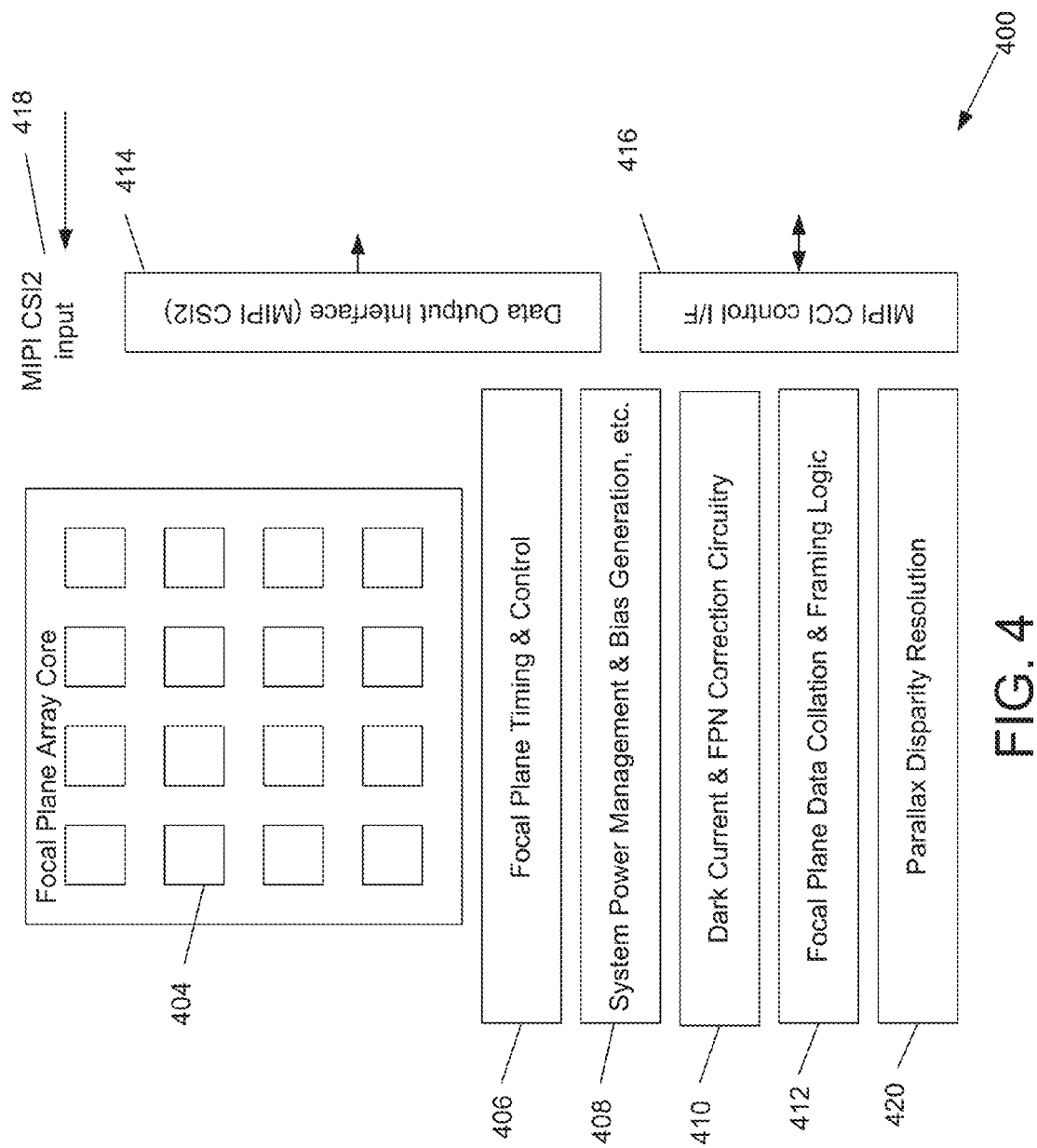
FIG. 4 conceptually illustrates an imager array architecture in accordance with an embodiment of the invention.

An imager array in accordance with an embodiment of the invention is illustrated in FIG. 4. The imager array 400 includes a focal plane array core 402 that includes a M×N array of focal planes 404 and all analog signal processing, pixel level control logic, signaling, and analog-to-digital conversion circuitry. The imager array also includes focal plane timing and control circuitry 406 that is responsible for controlling the capture of image information using the pixels. For example, in some embodiments, the focal plane timing and control circuitry 406 can synchronize the capture of image data by the focal planes such that active focal planes capture image data from a scene simultaneously. In many embodiments, the focal plane timing and control circuitry 406 causes the active focal planes to capture image data from a scene in a particular controlled sequence. In a number of embodiments, the focal plane timing and control circuitry 406 utilizes reset and read-out signals to control the integration time of the pixels. In several embodiments, any of a variety of techniques can be utilized to control integration time of pixels and/or to capture image information using pixels. In many embodiments, the focal plane timing and control circuitry 406 provides flexibility of image information capture control, which enables features including (but not limited to) high dynamic range imaging, high speed video, and electronic image stabilization. In various embodiments, the imager array 400 includes power management and bias generation circuitry 408. The power management and bias generation circuitry 408 provides current and voltage references to analog circuitry such as the reference voltages against which an ADC would measure the signal to be converted against. In many embodiments, the power management and bias circuitry also includes logic that turns off the current/voltage references to certain circuits when they are not in use for power saving reasons. In several embodiments, the imager array includes dark current and fixed pattern (FPN) correction circuitry 410 that increases the consistency of the black level of the image data captured by the imager array and can reduce the appearance of row temporal noise and column fixed pattern noise. In several embodiments, each focal plane includes reference pixels for the purpose of calibrating the dark current and FPN of the focal plane and the control circuitry can keep the reference pixels active when the rest of the pixels of the focal plane are powered down in order to increase the speed with which the imager array can be powered up by reducing the need for calibration of dark current and FPN. In many embodiments, the SOC imager includes focal plane framing circuitry 412 that packages the data captured from the focal planes into a container file and can prepare the captured image data for transmission. In several embodiments, the focal plane framing circuitry 412 includes information identifying the focal plane and/or group of pixels from which the captured image data originated. In a number of embodiments, the imager array 400 also includes an interface for transmission of captured image data to external devices. In the illustrated embodiment, the interface is a MIPI CSI 2 output interface supporting four lanes that can support read-out of video at 30 fps from the imager array and incorporating data output interface circuitry 414, interface control circuitry 416 and interface input circuitry 418. Typically, the bandwidth of each lane is optimized for the total number of pixels in the imager array and the desired frame rate. The use of various interfaces including the MIPI CSI 2 interface to transmit image data captured by an array of focal planes within an imager array to an external device in accordance with embodiments of the invention is described in U.S. Pat. No. 8,305,456 cited to and incorporated by reference above.

An imager array in accordance with embodiments of the invention can include a single controller that can separately sequence and control each focal plane. Having a common controller and I/O circuitry can provide important system advantages including lowering the cost of the system due to the use of less silicon area, decreasing power consumption due to resource sharing and reduced system interconnects, simpler system integration due to the host system only communicating with a single controller rather than M×N controllers and read-out I/O paths, simpler array synchronization due to the use of a common controller, and improved system reliability due to the reduction in the number of interconnects.

Additionally, an imager array in accordance with embodiments of the invention may include a parallax disparity resolution module 420 that can determine disparity between pixels in different images captured by the camera array using parallax detection processes similar to those described in U.S. Pat. No. 8,619,082 entitled "Systems and Methods for Parallax Detection and Correction in Images Captured Using Array Cameras" to Venkataraman et al., the disclosure of which is incorporated by reference herein in its entirety, especially as it pertains to array cameras employing parallax detection, depth estimation, and image correction processes. In embodiments where one-dimensional array camera modules or array cameras or implemented (e.g. M=1), the processing requirements for a parallax disparity resolution calculation may be sufficiently low that the process may be computed by the imager array circuitry.

Although specific components of an imager array architecture are discussed above with respect to FIG. 4, any of a variety of imager arrays can be constructed in accordance with embodiments of the invention that enable the capture of images of a scene at a plurality of focal planes in accordance with embodiments of the invention. Moreover, array cameras and array camera modules can be constructed using multiple discrete cameras. Array camera modules that utilize imager arrays are discussed below.

Array Camera Modules

Array camera modules in accordance with many embodiments of the invention include the combination of an optic array including a M×N array of lens stacks and an imager array that includes a M×N array of focal planes. Each lens stack in the optic array defines a separate optical channel. The optic array may be mounted to an imager array that includes a focal plane for each of the optical channels, where each focal plane includes an array of pixels or sensor elements configured to capture an image. When the optic array and the imager array are combined with sufficient precision, the array camera module can be utilized to capture image data from multiple images of a scene that can be read out to a processor for further processing, e.g. to synthesize a high resolution image using super-resolution processing. For example, each of the cameras in an array camera module can capture image data of a scene reflecting a sub-pixel shifted view of the scene—i.e. relative to the corresponding image formed by at least one other camera (e.g. the lens stack of each camera can have a field-of-view that is shifted with respect to the field-of-view of each other camera so that each shift includes a sub-pixel shifted view of the scene); hence, the aggregated image data can embody sufficient sampling diversity to enable the implementation of super-resolution processes that can be used to construct an enhanced image of the scene using the aggregated image data. In other words, each lens stack can form an image of a scene onto a corresponding focal plane, and thereby generate image data, from a slightly different viewpoint relative to an image formed by each of the other lens stacks, such that the images formed of the scene by each of the lens stacks contain non-redundant information of about the scene. Hence, the non-redundant information can be used in the construction of a super-resolved image.

In many embodiments, the optics in an array camera module are designed to be able to resolve images to a sufficient extent such that the super-resolution processes can be implemented. For example, in many instances, the MTF of the optics is able to resolve variation in intensity at the spatial resolution of the image that is to result from implemented super-resolution processes (e.g. as opposed to the spatial resolution of the image that can be formed by a single respective camera within an array camera module).

It should be noted that although 'arrays of lens stacks' and 'arrays of focal planes' are referenced, it is not meant to be suggested that such arrays are necessarily monolithic structures. In many instances a plurality of distinct lens stacks are disposed relative to one-another to form a M×N array of lens stacks; similarly, in many instances a plurality of distinct focal planes are disposed relative to one-another to form a M×N array of focal planes. In general, a plurality of lens stacks, and a plurality of focal planes can be adjoined in any suitable way to construct a M×N array camera module in accordance with embodiments of the invention. For example, U.S. Provisional Pat. App. Ser. Nos. 61/901,378 and 61/904,947 disclose non-monolithic array camera configurations. U.S. Provisional Pat. App. Ser. Nos. 61/901,378 and 61/904,947 are incorporated by reference in their entirety, especially as they pertain to non-monolithic array camera configurations including processes for constructing such configurations. In many instances, the focal planes and/or lens stacks are embodied within monolithic structures.

Additionally, it should be clear that one-dimensional array cameras and array camera modules can also be implemented in accordance with embodiments of the invention. One-dimensional array cameras and array camera modules are disclosed in U.S. Pat. App. Pub. No. 2014/0240528 entitled "Thin Form Factor Computational Array Cameras and Modular Array Cameras". The disclosure of U.S. Pat. Pub. No. 2014/0240528 is hereby incorporated by reference in its entirety, especially as it pertains to architectures and configurations for one-dimensional array cameras and array camera modules.

Figure 5:
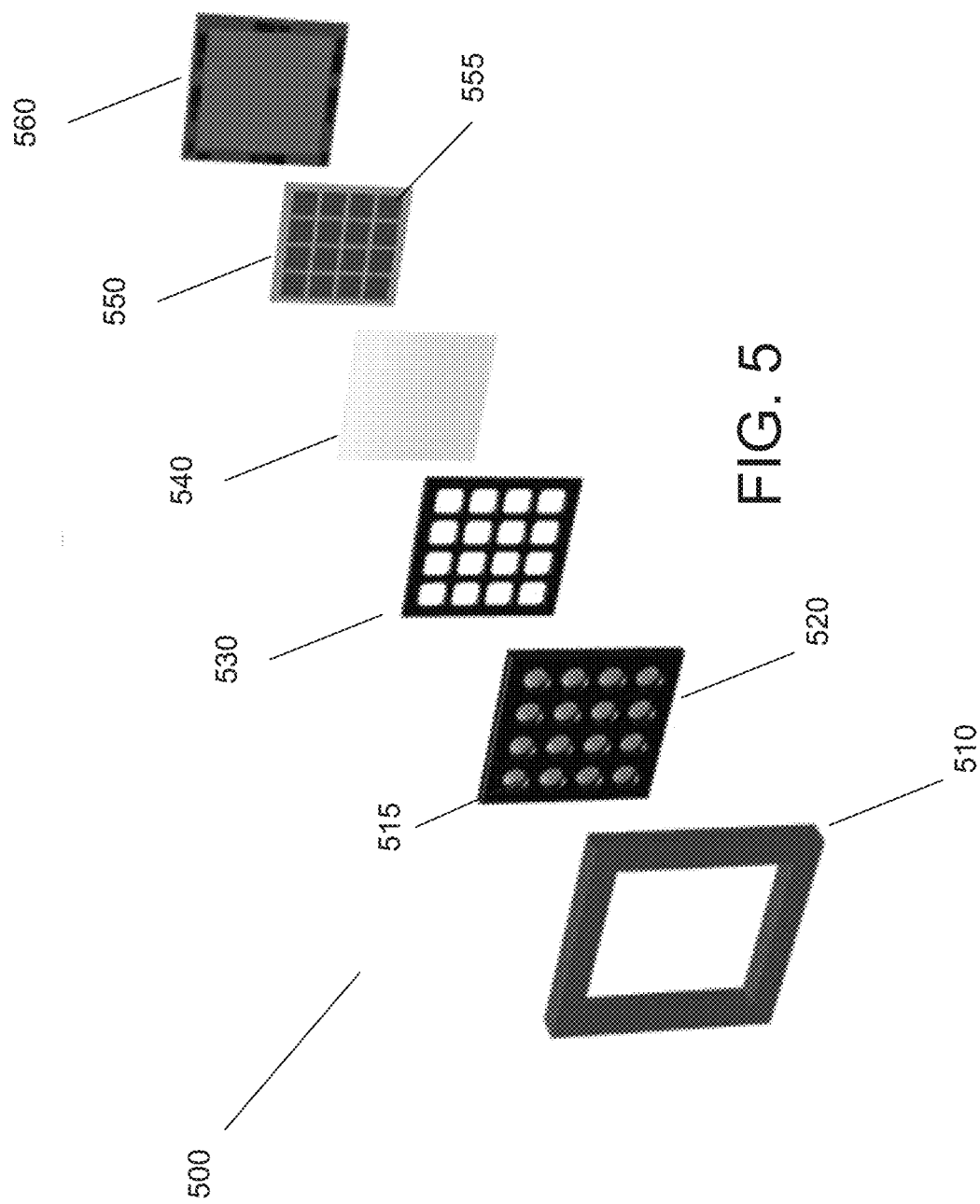
FIG. 5 conceptually illustrates the construction of an array camera module in accordance with an embodiment of the invention.

An exploded view of an array camera module formed by combining a lens stack array with a monolithic sensor including an array of focal planes in accordance with an embodiment of the invention is illustrated in FIG. 5. The array camera module 500 includes housing 510, an optic array 520 including M×N distinct lens stacks 515 forming M×N separate apertures associated with M×N separate views of a scene, a spacer 530, a cover glass 540, and an image sensor 550 including M×N separate focal planes 555. Additionally, a PCB 560 is depicted; the array camera module 500 can be adjoined to the PCB to form the array camera. Each lens stack 515 in the optic array 520 creates an optical channel that resolves an image on one of the focal planes 555 on the imager array 550. Each of the lens stacks 515 may be of a different type. Importantly, each of the lens stacks can be associated with a different spectral filter. For example, in several embodiments, the optical channels are used to capture images of different portions of the wavelength of light spectrum (e.g. using color filters, located either within the lens stack or on the sensor) and the lens stack in each optical channel is specifically optimized for the portion of the spectrum imaged by the focal plane associated with the optical channel. In many embodiments, π filter groups are patterned onto the imager array; π filter groups are disclosed in U.S. Pat. App. Pub. No. 2013/0293760, the disclosure of which is hereby incorporated by reference in its entirety, especially as it pertains to color filter configurations that adopt a π filter group pattern.

In many embodiments, the array camera module 500 includes lens stacks 515 having one or multiple separate optical lens elements axially arranged with respect to each other. Optic arrays of lens stacks 520 in accordance with several embodiments of the invention include one or more adaptive optical elements that can enable the independent adjustment of the focal length of each lens stack and/or lateral shifting of the centration of the refractive power distribution of the adaptive optical element. The use of adaptive optical elements is described in U.S. Pat. App. Pub. No. 2013/0088637, entitled "Lens Stack Arrays Including Adaptive Optical Elements", the disclosure of which is incorporated by reference herein in its entirety, especially as it pertains to the incorporation of adaptive elements within lens stacks.

The optic arrays of lens stacks and the imager array can be aligned and adjoined using any of a variety of techniques. For instance, the alignment techniques disclosed in U.S. Pat. App. Pub. No. 2014/0002674, U.S. patent application Ser. No. 14/195,675, and PCT Pat. App. Pub. No. WO/2014/160142 can be implemented in accordance with embodiments of the invention. The disclosure of U.S. Pat. App. Pub. No. 2014/0002674 is incorporated by reference in its entirety, especially as it pertains to assembling an array camera module by repeatedly measuring the efficacy of the module as a function of the spatial orientation between an optic array and an imager array. The disclosure of U.S. patent application Ser. No. 14/195,675 is incorporated by reference in its entirety, especially as it pertains to determining a preferred spatial orientation for a representative optic array of lens stacks and a representative imager array, and implementing that spatial arrangement onto a plurality of constituent optic arrays and imager arrays to assemble a series of array camera modules. The disclosure of PCT App. Pub. No. WO/2014/160142 is incorporated by reference in its entirety, especially as it pertains to aligning an optical array of lens stacks with an imager array such that each of at least two constituent cameras are characterized by different central viewing directions.

As mentioned above, in many instances, array camera modules employ wafer level optics (WLO) technology. WLO is a technology that encompasses a number of processes, including, for example, molding of lens arrays on glass wafers, stacking of those wafers (including wafers having lenses replicated on either side of the substrate) with appropriate spacers, followed by packaging of the optics directly with the imager into a monolithic integrated module. The WLO procedure may involve, among other procedures, using a diamond-turned mold to create each plastic lens element on a glass substrate. More specifically, the process chain in WLO generally includes producing a diamond turned lens master (both on an individual and array level), then producing a negative mold for replication of that master (also called a stamp or tool), and then finally forming a polymer replica on a glass substrate, which has been structured with appropriate supporting optical elements, such as, for example, apertures (transparent openings in light blocking material layers), and spectral filters. U.S. Pat. No. 8,231,814, entitled "Fabrication Process for Mastering Imaging Lens Arrays" discloses similar techniques and is hereby incorporated by reference in its entirety, especially as it pertains to replicating a lenses across a substrate to form a master waferscale lens array. As alluded to above, WLO processes can be advantageous insofar as spectral filters can be embedded within the fabricated lenses. However, in many embodiments, lenses within the lens stacks are fabricated using techniques other than WLO processes, e.g. precision glass molding techniques, polymer injection molding techniques or wafer level polymer monolithic lens processes. These manufacturing techniques may not be as amenable to embedding spectral filters within the fabricated lenses. Accordingly, in many embodiments, spectral filters are disposed within glass substrates within, or proximate, the optical stack. This configuration is now discussed in greater detail below.

Figure 6:
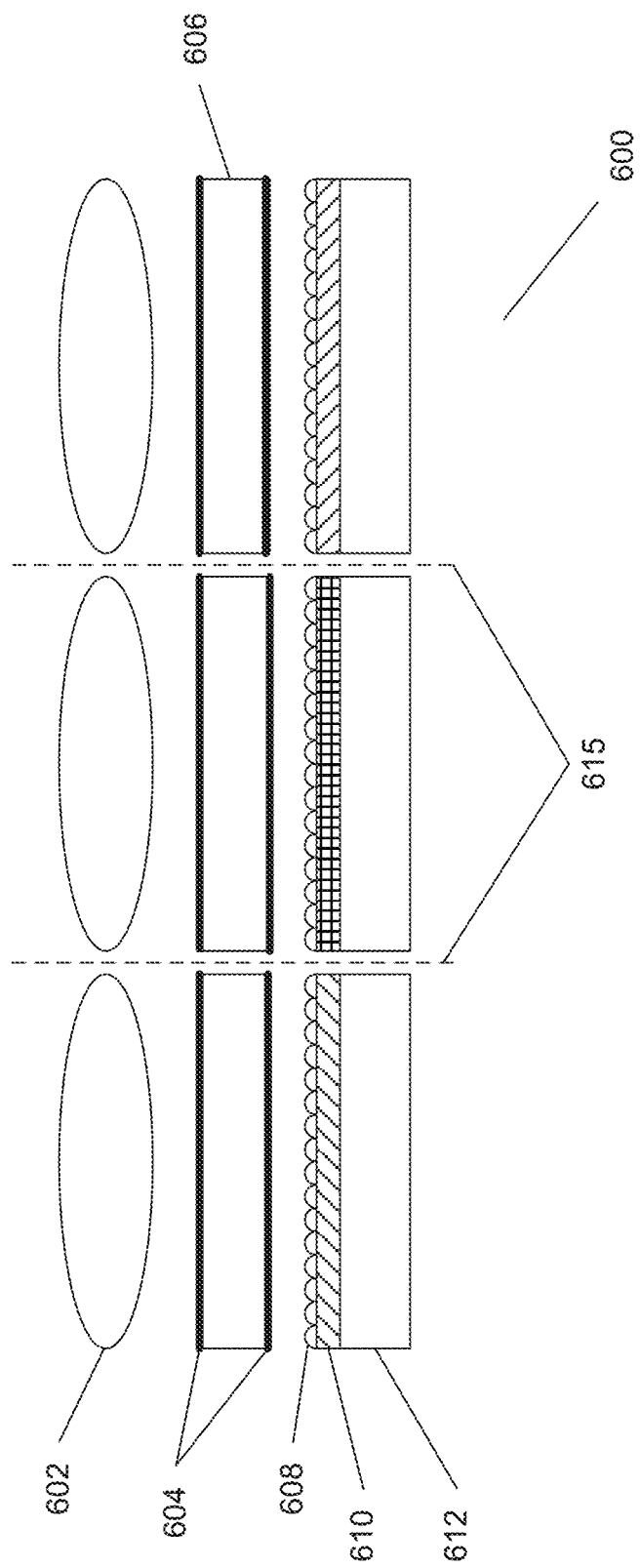
FIG. 6 depicts a portion of an array camera module that includes spectral filters embedded within its image sensors.

Array Cameras and Array Camera Modules Having Spectral Filters Disposed within a Glass Substrate Outside of an Image Sensor In many embodiments, a spectral filter for at least one of the camera modules within an array camera or array camera module is disposed at a distance from the image sensor and within a glass substrate. While many array cameras and array camera modules can include spectral filters within image sensors, this configuration can result in an increased pixel stack height, which as discussed above with respect to FIG. 1 can exacerbate the detrimental impact caused by crosstalk phenomena. For example, FIG. 6 illustrates a schematic for an array camera module that includes spectral filters disposed within the pixel stacks of an image sensor. In particular, the array camera module 600 includes optics 602, a cover glass 606 coated with antireflective coating 604, and an image sensor that includes microlenses 608, spectral filters 610, and a semiconductor component that incorporates sensor elements 612. Construction lines 615 indicate that the illustrated array camera module can either be a monolithic array camera module or else an array camera module constructed from separate camera modules. As can be seen, the inclusion of the spectral filter within the image sensor can undesirably increase the pixel stack height. Accordingly, in many embodiments, array cameras and/or array camera modules include spectral filters that are disposed outside of the image sensor. In this way, the pixel stack height can be reduced, and the accompanying crosstalk phenomena can be avoided. While FIG. 6 depicts an array camera having homogenous filters that correspond to each optical channel, in many instances array cameras employ a Bayer filter arrangement for at least one optical channel.

Figure 7:
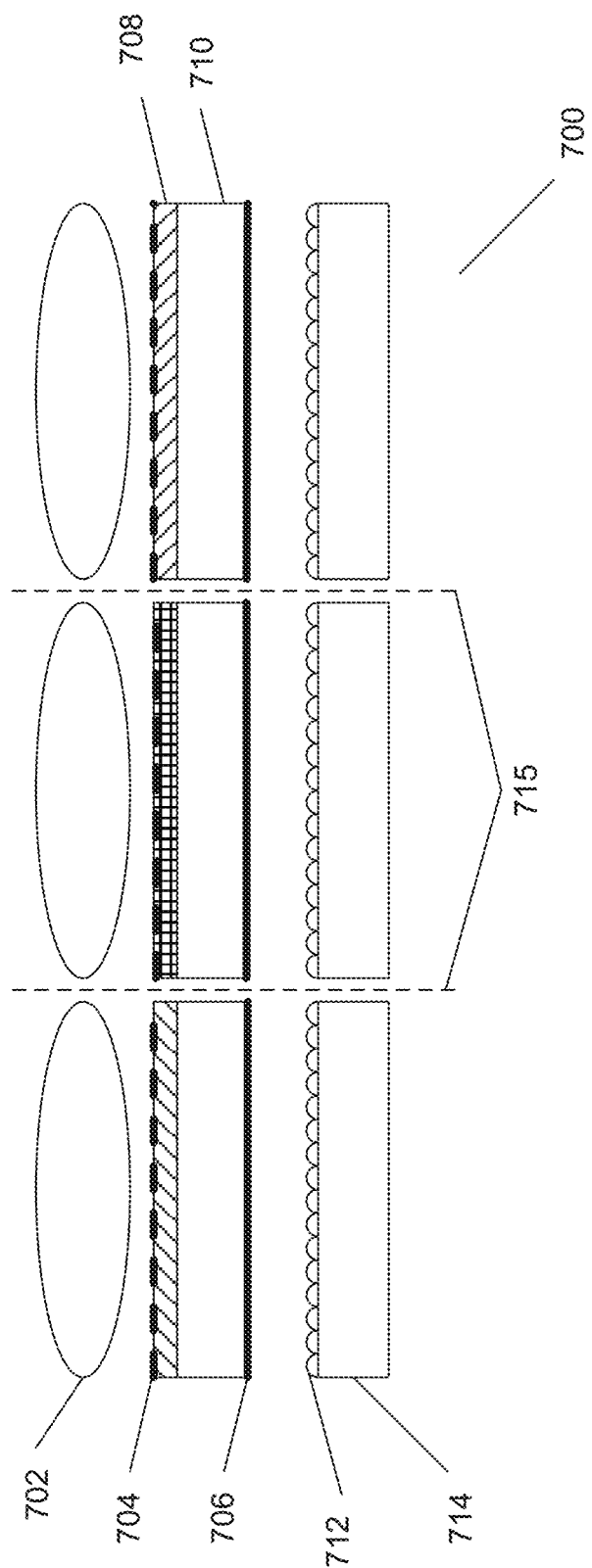
FIG. 7 depicts a portion of an array camera module that includes spectral filters disposed on its constituent cover glass in accordance with a further embodiment of the invention.

Further, as mentioned above, in many instances, the optics of array cameras and array camera modules are fabricated using technologies that typically do not allow spectral filters to be embedded within the optics. Accordingly, in many embodiments, array cameras and array camera modules include at least one camera module that includes a spectral filter disposed proximate or within a glass substrate spaced a distance from the image sensor, where the distance defines an air gap between the glass substrate and the image sensor. For example, FIG. 7 depicts a schematic for an array camera module that includes spectral filters disposed proximate the cover glass and in between the cover glass and the optics. In particular, the array camera module 700 includes optics 702, spectral filters 708 adjacent to respective cover glasses 710, and an image sensor 714 including microlenses 712. As before, construction lines 715 are depicted to indicate that the illustrated array camera module can either be a monolithic array camera module or else an array camera module constructed from separate camera modules. Importantly, the aggregate of the cover glass and the spectral filters are coated with anti-reflective coatings 704, 706; specifically, the spectral filters are coated with antireflective coating 704, and the cover glasses are coated with a second antireflective coating 706. As can be appreciated, anti-reflective coatings can be implemented to reduce ghosting and enhance general stray light behavior. Importantly, note that while FIG. 7 depicts a spectral filter in between the cover glass and the optics, in many embodiments of the invention, the spectral filter is disposed proximate the cover glass and in between the cover glass and the image sensor.

In many instances, the spectral filters are not amenable to being coated with the antireflective coating. In other words, the antireflective coating may not be able to be sufficiently adjoined to the spectral filters; this can be due to any number of reasons. For example, anti-reflective coatings are typically applied using processes such as chemical vapor deposition, evaporation, sputtering, etc., and the color filters may not be able to withstand these processes since the color filters may not be sufficiently stable, even when fully cured (e.g. due to high temperature, ion bombardment, plasma, that may be experienced during the anti-reflective coating application process, etc.).

Figure 8:
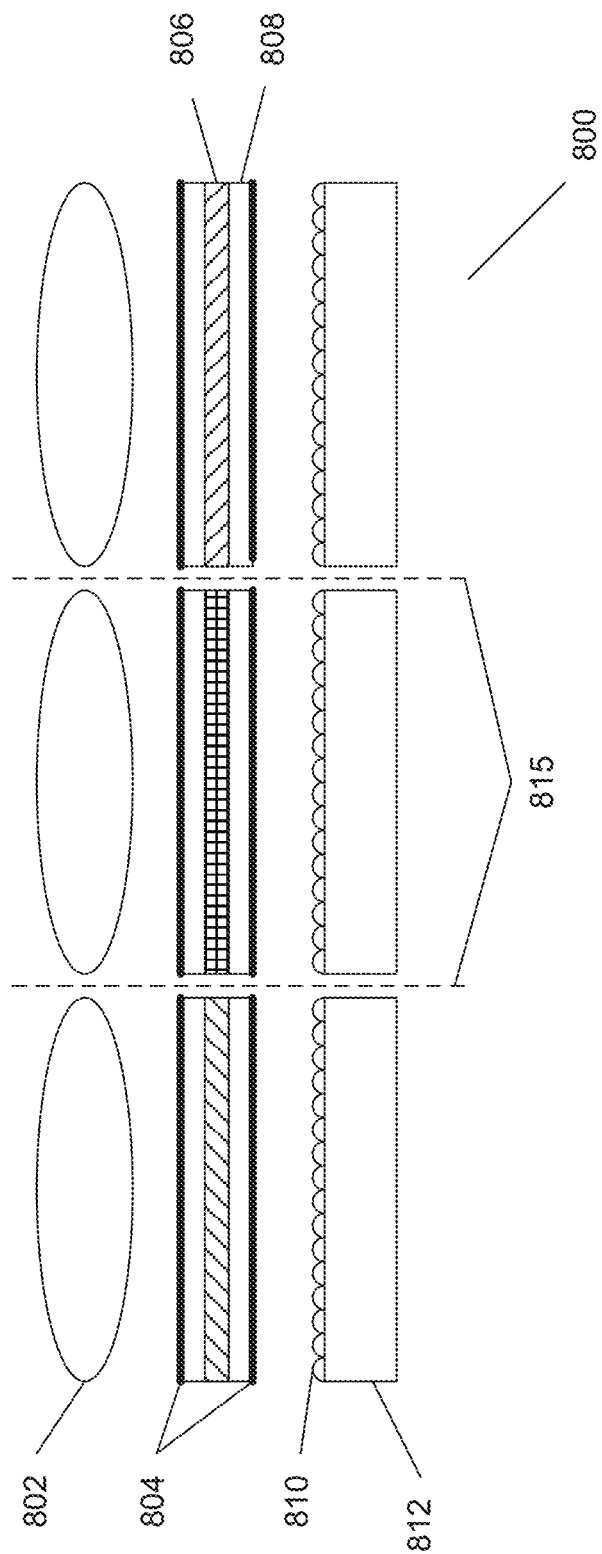
FIG. 8 depicts a portion of an array camera module that includes spectral filters disposed within its constituent cover glass in accordance with another embodiment of the invention.

Accordingly, in many embodiments, spectral filters are embedded within the cover glass. Thus, antireflective coatings can be sufficiently adhered to the cover glass (which can be made to be more stable), and spectral filtration can still be achieved. For example, FIG. 8 depicts a schematic for an array camera module that includes spectral filters embedded within a cover glass. In particular, FIG. 8 illustrates an array camera module 800 that includes optics 802 and respective cover glasses 808 that includes embedded spectral filters 806. The array camera module 800 further includes an image sensor 812 that includes microlenses 810. As before, construction lines 815 are depicted to indicate that the illustrated array camera module can either be a monolithic array camera module or else an array camera module constructed from separate camera modules. Additionally, note that the cover glass 808 is coated with anti-reflective coatings 804. In many embodiments, the index of refraction of the spectral filter and cover glass are made to be approximately similar so as to reduce the development of reflections within the glass.

In numerous embodiments, the color filter has a relatively small thickness so as not to disturb the optomechanical design of the respective camera module. For example, in many embodiments, the color filter has a thickness of between approximately 0.1 μm and 1 μm. Although, of course color filters of any suitable thickness can be implemented. Where a color filter is relatively thicker, the optomechanics of the camera module can be redesigned so as to accommodate the thickness.

In many instances the combination of the cover glass and the color filter is assembled by sandwiching a color filter in between two separated portions of a cover glass (e.g. two halves of a cover glass) and laminating/gluing this sandwich structure. In many instances, each of the two portions is greater than some threshold thickness. For example, in many embodiments, each of the two portions has a thickness greater than approximately 200 μm. In some embodiments, each of the two portions has a thickness greater than approximately 150 μm. In several embodiments, each of the portions has a thickness greater than approximately 100 μm. In general, the thicker portions can facilitate the lamination/gluing processes.

While spectral filters have been depicted and discussed as being disposed proximate or within a cover glass, it should be clear that spectral filters can be disposed within any suitable transparent substrate outside of the image sensor in accordance with embodiments of the invention. In many embodiments, hybrid spectral filters are implemented within array cameras and/or array camera modules, and this aspect is now discussed in greater detail.

Hybrid Spectral Filters

In many embodiments, hybrid infrared cut-off filters ("hybrid IRCF" filters) are implemented within array cameras and array camera modules. Hybrid IRCF filters include dielectric infrared cut-off filters (IRCF) and 'blue glass' in aggregate. By way of background 'blue glass' is a glass that shows spectral absorption in the near infrared (NIR) spectral domain. The benefit of combining these two IRCF mechanisms is that due to the absorptive blocking component of the blue glass, the spectral sensitivity of the band edge as well as the dependency on the angle of incidence may not be as strong relative to using a purely dielectric IRCF. Similarly, the dielectric IRCF sharpens the band edge of the filter system over that if only an absorptive filter was used. In many instances, blue glass is used as the substrate material of the dielectric IRCF to build a hybrid IRCF filter.

Figure 9:
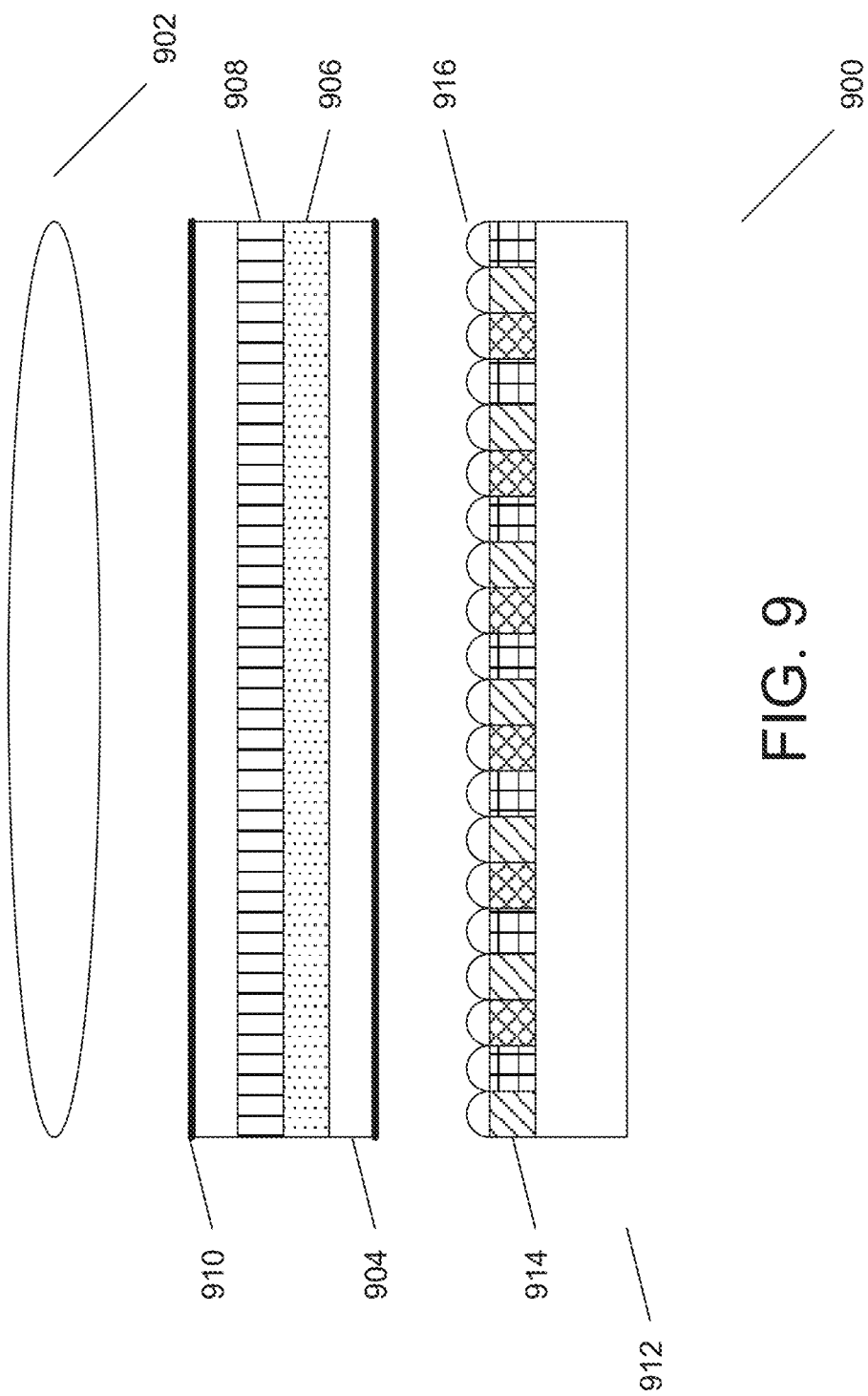
FIG. 9 depicts a camera module that can be embedded within an array camera module that includes a hybrid infrared cutoff filter in accordance with an embodiment of the invention.

Note that 'blue glass' can have poor resistance to moisture. Accordingly, in many embodiments, the hybrid infrared cut-off filters are disposed within a glass substrate that is outside a constituent image sensor, e.g. similar to the configuration described above. For example, FIG. 9 depicts a camera module—that can be implemented within an array camera—that includes a hybrid spectral filter in accordance with an embodiment of the invention. In particular, the camera module 900 includes optics 902, a cover glass 908 including an embedded hybrid IRCF filter that includes a dielectric cutoff filter 906 and blue glass 908 in aggregate. The cover glass is coated with antireflection coating 910. The camera module further includes an image sensor 912, including an associated Bayer filter 914, and microlenses 916. This configuration allows an effective, and environmentally stable, infrared cutoff filter to be implemented within an array camera module. It should be appreciated that although a Bayer filter is depicted, any of a variety of filters and filtering arrangements can be implemented in conjunction with the configuration depicted in FIG. 9. For instance, in many embodiments, a homogenous color filter is implemented within the pixel stack. More generally, while FIG. 9 depicts that additional spectral filters disposed at the image sensor level, it should be clear that the incorporation of a hybrid IRCF filter can be implemented in any of a variety of arrangements. For example, in many embodiments, an additional spectral filter (e.g. a color filter) is disposed elsewhere within the lens stack. In some embodiments, an additional spectral filter is disposed within the same cover glass as the hybrid spectral filter. In general, it should be clear that hybrid IRCF filters can be used in conjunction with any of a variety of arrangements in accordance with embodiments of the invention.

Although, it should be noted that 'blue glass' typically requires some thickness in order to achieve the desired effect. Hence, the optomechanics of the respective camera module may need to be tailored to accommodate the inclusion of hybrid spectral filters. Although, in many instances, the tailored design of the optomechanics can be mitigated. For example, in some embodiments, the optical density of the 'blue glass' is increased so that it can be effectively implemented in a relatively thinner form factor. In many embodiments, because 'blue glass' is sensitive to humidity, the glass substrate that includes the hybrid IRCF filter is sealed from the sides, e.g. by resin.

Although the present invention has been described in certain specific aspects, many additional modifications and variations would be apparent to those skilled in the art. For instance, in many embodiments, an array camera module includes at least one camera module that includes a Bayer filter within its image sensor, at least one camera module that includes a hybrid IRCF filter disposed within a cover glass, and/or at least one camera module that includes a color spectral filter (e.g. red, green, or blue) that is disposed within its respective cover glass. It is therefore to be understood that the present invention may be practiced otherwise than specifically described. Thus, embodiments of the present invention should be considered in all respects as illustrative and not restrictive.

What is claimed is:

1. An array camera module comprising:
   lens elements arranged to form a plurality of optical channels, each optical channel comprising a separate aperture, and thereby being configured to image a distinct view of a scene;
   a plurality of focal planes, where each focal plane comprises a plurality of rows of pixel stacks that also form a plurality of columns of pixel stacks, and where each focal plane does not include pixel stacks from another focal plane;
   at least one cover glass that is disposed immediately adjacent to at least one focal plane and thereby covers all of the pixel stacks within the at least one focal plane; and
   at least one spectral filter that is embedded within at least one cover glass;
   wherein:
   each optical channel is associated with a focal plane;
   each pairing of an optical channel and a corresponding focal plane defines a camera;
   the at least one cover glass is flat and uniformly thick;
   the at least one spectral filter filters all the light that impinges on all of the pixel stacks of at least one focal plane; and
   each pixel stack comprises a single microlens and a single photodetector, and each respective single microlens is configured to focus incident electromagnetic waves onto the corresponding single photodetector.

2. The array camera module of claim 1, wherein each spectral filter within the array camera module is embedded within at least one cover glass.

3. The array camera module of claim 1, wherein the cover glass is coated with an anti-reflective coating.

4. The array camera module of claim 1, wherein the index of refraction of the spectral filter embedded within the cover glass is approximately similar to the index of refraction of the cover glass.

5. The array camera module of claim 1, wherein the spectral filter is disposed between a first portion of the cover glass and a second portion of the cover glass wherein:
   the first portion of the cover glass has a thickness greater than approximately 100 μm; and
   the second portion of the cover glass has a thickness greater than approximately 100 μm.

6. The array camera module of claim 5, wherein:
   the first portion of the cover glass has a thickness greater than approximately 150 μm; and
   the second portion of the cover glass has a thickness greater than approximately 150 μm.

7. The array camera module of claim 6, wherein:
   the first portion of the cover glass has a thickness greater than approximately 200 μm; and
   the second portion of the cover glass has a thickness greater than approximately 200 μm.

8. The array camera module of claim 5, wherein:
   the spectral filter has a thickness of between approximately 0.1 μm and 1 μm.

9. The array camera module of claim 1, wherein the spectral filter comprises blue glass and a dielectric infrared cut-off filter.

10. The array camera module of claim 9, wherein the cover glass that includes the spectral filter that comprises blue glass and a dielectric infrared cut-off filter is sealed such so as to hinder the ability of ambient moisture to access the blue glass.

11. The array camera module of claim 10, wherein the cover glass is sealed using resin.

12. The array camera module of claim 1, wherein at least one pixel comprises a quantum film that itself comprises a plurality of quantum dots.

13. The array camera module of claim 1, wherein at least one focal plane includes at least one spectral filter that is disposed proximate at least one pixel stack within the focal plane that filters the electromagnetic waves that are directed to the at least one photo detector of the focal plane.

14. The array camera module of claim 13, wherein the at least one focal plane that includes at least one spectral filter includes a plurality of spectral filters that define a Bayer-filter pattern.

15. The array camera module of claim 14, wherein at least one spectral filter that is embedded within a cover glass comprises blue glass and a dielectric infrared cut-off filter.

16. The array camera module of claim 1, wherein each of the optical channels includes a field-of-view that is shifted with respect to the fields-of-views of each other optical channel so that each shift includes a sub-pixel shifted view of a targeted scene.

17. The array camera module of claim 1, wherein the lens elements, the at least one cover glass, the at least one spectral filter, and the plurality of focal planes are embodied within a monolithic structure.

18. The array camera module of claim 1, wherein the lens elements, the at least one cover glass, the at least one spectral filter, and the plurality of focal planes are embodied in a non-monolithic structure.

* * * * *